(12) United States Patent
Liu

(10) Patent No.: US 8,030,636 B2
(45) Date of Patent: Oct. 4, 2011

(54) ENHANCED MEMORY DENSITY RESISTANCE VARIABLE MEMORY CELLS, ARRAYS, DEVICES AND SYSTEMS INCLUDING THE SAME, AND METHODS OF FABRICATION

(75) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/848,891

(22) Filed: Aug. 2, 2010

(65) Prior Publication Data

US 2010/0295011 A1    Nov. 25, 2010

Related U.S. Application Data

(60) Continuation of application No. 12/491,911, filed on Jun. 25, 2009, now Pat. No. 7,791,058, which is a division of application No. 11/511,311, filed on Aug. 29, 2006, now Pat. No. 7,560,723.

(51) Int. Cl.
*H01L 29/02* (2006.01)
*H01L 21/00* (2006.01)

(52) U.S. Cl. ............. 257/2; 257/4; 257/5; 257/E31.001; 257/E31.008; 438/95; 438/242; 438/259

(58) Field of Classification Search .................... 438/95, 438/242, 259; 257/2, 4, 5, 365, 618, E31.001, 257/E31.008

See application file for complete search history.

(56) References Cited

U.S. PATENT DOCUMENTS

| | | | |
|---|---|---|---|
| 3,271,591 | A | 9/1966 | Ovshinsky |
| 3,622,319 | A | 11/1971 | Sharp |
| 3,743,847 | A | 7/1973 | Boland |
| 3,961,314 | A | 6/1976 | Klose et al. |
| 3,966,317 | A | 6/1976 | Wacks et al. |
| 3,983,542 | A | 9/1976 | Ovshinsky |
| 3,988,720 | A | 10/1976 | Ovshinsky |
| 4,177,474 | A | 12/1979 | Ovshinsky |
| 4,267,261 | A | 5/1981 | Hallman et al. |
| 4,269,935 | A | 5/1981 | Masters et al. |
| 4,312,938 | A | 1/1982 | Drexler et al. |
| 4,316,946 | A | 2/1982 | Masters et al. |
| 4,320,191 | A | 3/1982 | Yoshikawa et al. |

(Continued)

FOREIGN PATENT DOCUMENTS

CN    1449046 A    10/2003

(Continued)

OTHER PUBLICATIONS

Benmore, C.J.; Salmon, P.S., Structure of Fast Ion Conducting and Semiconducting Glassy Chalcogenlde Alloys, Phys. Rev. Lett. 73 (1994) 264-267.

(Continued)

*Primary Examiner* — Hsien Ming Lee
(74) *Attorney, Agent, or Firm* — Dickstein Shapiro LLP

(57) ABSTRACT

A resistance variable memory cell and method of forming the same. The memory cell includes a first electrode and at least one layer of resistance variable material in contact with the first electrode. A first, second electrode is in contact with a first portion of the at least one layer of resistance variable material and a second, second electrode is in contact with a second portion of the at least one layer of resistance variable material.

25 Claims, 20 Drawing Sheets

U.S. PATENT DOCUMENTS

| | | |
|---|---|---|
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolsteinholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki et al. |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B2 | 1/2003 | Hudgens et al. |
| 6,511,867 B2 | 1/2003 | Lowery et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,545,287 B2 | 4/2003 | Chiang |
| 6,545,907 B1 | 4/2003 | Lowery et al. |
| 6,555,860 B2 | 4/2003 | Lowery et al. |
| 6,563,164 B2 | 5/2003 | Lowery et al. |
| 6,566,700 B2 | 5/2003 | Xu |
| 6,567,293 B1 | 5/2003 | Lowery et al. |
| 6,569,705 B2 | 5/2003 | Chiang et al. |
| 6,570,784 B2 | 5/2003 | Lowery |
| 6,576,921 B2 | 6/2003 | Lowery |
| 6,586,761 B2 | 7/2003 | Lowery |
| 6,589,714 B2 | 7/2003 | Maimon et al. |
| 6,590,807 B2 | 7/2003 | Lowery |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,613,604 B2 | 9/2003 | Maimon et al. |
| 6,621,095 B2 | 9/2003 | Chiang et al. |
| 6,625,054 B2 | 9/2003 | Lowery et al. |
| 6,635,914 B2 | 10/2003 | Kozicki et al. |
| 6,638,820 B2 | 10/2003 | Moore |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowery et al. |
| 6,671,710 B2 | 12/2003 | Ovshinsky et al. |
| 6,673,648 B2 | 1/2004 | Lowrey |
| 6,673,700 B2 | 1/2004 | Dennison et al. |
| 6,674,115 B2 | 1/2004 | Hudgens et al. |
| 6,687,153 B2 | 2/2004 | Lowery |
| 6,687,427 B2 | 2/2004 | Ramalingam et al. |
| 6,690,026 B2 | 2/2004 | Peterson |
| 6,696,355 B2 | 2/2004 | Dennison |
| 6,707,712 B2 | 3/2004 | Lowery |
| 6,714,954 B2 | 3/2004 | Ovshinsky et al. |
| 6,855,975 B2 | 2/2005 | Gilton |

| | | |
|---|---|---|
| 6,867,114 B2 | 3/2005 | Moore et al. |
| 6,867,996 B2 | 3/2005 | Campbell et al. |
| 6,870,751 B2 | 3/2005 | Van Brocklin et al. |
| 6,894,304 B2 | 5/2005 | Moore |
| 6,969,633 B2 | 11/2005 | Dennison |
| 7,057,923 B2 | 6/2006 | Furkay et al. |
| 7,071,485 B2 | 7/2006 | Takaura et al. |
| 7,208,751 B2 | 4/2007 | Ooishi |
| 7,214,958 B2 | 5/2007 | Happ |
| 7,314,776 B2 * | 1/2008 | Johnson et al. ........... 438/95 |
| 7,427,770 B2 | 9/2008 | Daley |
| 7,442,602 B2 | 10/2008 | Park et al. |
| 7,514,288 B2 * | 4/2009 | Lung et al. ........... 438/102 |
| 7,541,288 B2 * | 6/2009 | Kim et al. ........... 438/695 |
| 7,560,723 B2 | 7/2009 | Liu |
| 7,572,666 B2 * | 8/2009 | Dennison et al. ........... 438/95 |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki |
| 2002/0168852 A1 | 11/2002 | Harshfield et al. |
| 2002/0190289 A1 | 12/2002 | Harshfield et al. |
| 2002/0190350 A1 | 12/2002 | Kozicki et al. |
| 2003/0001229 A1 | 1/2003 | Moore et al. |
| 2003/0001230 A1 | 1/2003 | Lowrey |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li et al. |
| 2003/0068862 A1 | 4/2003 | Li et al. |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156452 A1 | 8/2003 | Gilton |
| 2003/0156463 A1 | 8/2003 | Casper et al. |
| 2003/0183868 A1 | 10/2003 | Fricke et al. |
| 2003/0201469 A1 | 10/2003 | Lowrey |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |
| 2005/0074933 A1 | 4/2005 | Lowrey |
| 2005/0122757 A1 | 6/2005 | Moore et al. |
| 2005/0180189 A1 | 8/2005 | Happ et al. |
| 2005/0287698 A1 | 12/2005 | Li et al. |
| 2006/0049390 A1 | 3/2006 | Ufert et al. |
| 2006/0110878 A1 | 5/2006 | Lung et al. |
| 2006/0125108 A1 | 6/2006 | Gutsche et al. |
| 2006/0175640 A1 | 8/2006 | Happ et al. |
| 2006/0240616 A1 | 10/2006 | Daly |
| 2007/0059882 A1 | 3/2007 | Daly |
| 2007/0121369 A1 | 5/2007 | Happ |
| 2007/0232015 A1 | 10/2007 | Liu |
| 2009/0261316 A1 | 10/2009 | Liu |

FOREIGN PATENT DOCUMENTS

| | | |
|---|---|---|
| EP | 1 351 253 A1 | 10/2003 |
| JP | 5-6126916 | 10/1981 |
| WO | WO 97/48032 | 12/1997 |
| WO | WO 99/21235 | 4/1999 |
| WO | WO 99/28914 | 6/1999 |
| WO | WO 00/48196 | 8/2000 |
| WO | WO 02/21542 | 3/2002 |
| WO | WO/2005/117026 A1 | 12/2005 |

OTHER PUBLICATIONS

Bernede, J.C., Influence Du Metal Des Electrodes Sur Les Caracteristiques Courant-tension Des Structures M-Ag2Se-M, Thin Solid Films 70 (1980) L1-L4.

Bernede, J.C., Polarized Memory Switching in MIS Thin Films, Thin Solid Films 81 (1981) 155-160.

Bernede, J.C., Switching and Silver Movements in Ag2Se Thin Films, Phys. Stat. Sol. (a) 57 (1980) K101-K104.

Bernede, J.C.; Abachi, T., Differential Negative Resistance in Metal/insulator/metal Structures with an Upper Bilayer Electrode, Thin Solid Films 131 (1985) L61-L64.

Bernede, J.C.; Conan, A.; Fousenan't, E.; El Bouchairi, B.; Goureaux, G., Polarized Memory Switching Effects in Ag2Se/Se/M Thin Film Sandwiches, Thin Solid Films 97 (1982) 165-171.

Bernede, J.C.; Khelil, A.; Kettaf, M.; Conan, A., Transition from S- to N-type Differential Negative Resistance in Al-Al2O3-Ag2-xSe1+x Thin Film Structures, Phys. Stat. Sol. (a) 74 (1982) 217-224.

Bondarev, V.N.; Pikhitsa, P.V., A Dendrite Model of Current Instability in RbAg4I5, Solid State Ionics 70/71 (1994) 72-76.

Boolchand, P., The Maximum in Glass Transition Temperature (Tg) Near x=1/3 in GexSe1−x Glasses, Asian Journal of Physics (2000) 9, 709-72.

Boolchand, P.; Bresser, W.J., Mobile Silver Ions and Glass Formation in Solid Electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of Rigidity in Steps in Chalcogenide Glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural Ordering of Evaporated Amorphous Chalcogenlde Alloy Ffilms: Role of Thermal Annealing, Diffusion and Defect Data vol. 53-54 (1987) 415-420.

Boolchand, P.; Grothaus, J.; Bresser, W.J.; Suranyi, P., Structural Origin of Broken Chemical Order in a GeSe2 glass, Phys. Rev. B 25 (1982) 2975-2978.

Boolchand, P.; Grothaus, J.; Phillips, J.C., Broken Chemical Order and Phase Separation in GexSe1−x Glasses, Solid State Comm. 45 (1983) 183-185.

Boolchand, P., Bresser, W.J., Compositional Trends in Glass Transition Temperature (Tg). Network Connectivity and Nanoscale Chemlcal Phase Separation in Chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 Glasses Compared, Proc. Int. Conf. Phys. Semicond. (Eds. Chadi and Harrison) 17th (1985) 833-36.

Bresser, W.; Boolchand, P.; Suranyi, P., Rigidity Percolation and Molecular Clustering in Network Glasses, Phys. Rev. Lett. 56 (1986) 2493-2496.

Bresser, W.J.; Boolchand, P.; Suranyi, P.; de Neufville, J.P, Intrinsically Broken Chalcogen Chemical Order in Stolchiometric Glasses, Journal de Physique 42 (1981) C4-193-C4-196.

Bresser, W.J.; Boolchand, P.; Suranyi, P.; Hernandez, J.G., Molecular Phase Separation and Cluster Size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-temperature, Electric Field Induced Creation of Stable Devices in CuInSe2 Crystals, Science 258 (1992) 271-274.

Chatterjee, R.; Asokan, S.; Titus, S.S.K., Current-controlled Negative-resistance Behavior and Memory Switching in Bulk As-Te-Se Glasses J. Phys. D: Appl. Phys. 27 (1994) 2624-2627.

Hong. K.S.; Speyer, R.F., Switching Behavior in II-IV-V2 Amorphous Semiconductor Systems, J. Non-Cryst. Solids 116 (1990) 191-200.

Hosokawa, S., Atomic and Electronic Structures of Glassy GexSe1−x Around the Stiffness Threshold Composition, J. Optoelectronics and Advanced Materials 3 (2001) 199-214.

Hu. J.; Snell, A.J.; Hajto, J.; Owen, A.E., Constant Current Forming in Cr/p+a-Si:H/V Thin Film Devices, J. Non-Cryst. Solids 227-230 (1998) 1187-1191.

Hu, J.; Hajto, J.; Snell, A.J.; Owen, A.E.; Rose, M.J., Capacitance Anomaly Near the Metal-Non-metal Transition in Cr-hydrogenated Amorphous Si-V Thin-film Devices, Phil. Mag. B. 74 (1996) 37-50.

Hu, J.; Snell, A.J.; Hajto, J.; Owen, A.E., Current-induced Instability in Cr-p+a-Si:H-V Thin Film Devices, Phil. Mag. B 80 (2000) 29-43.

Huggett et al., Development of Silver Sensitized Germanium Selenide Photoresist by Reactive Sputter Etching in SF6, 42 Appl. Phys. Lett., No. 7, pp. 592-594 (Apr. 1983).

Iizima, S.; Sugi, M.; Kikuchi, M.; Tanaka, K., Electrical and Thermal Properties of Semiconducting Glasses As-Te-Ge, Solid State Comm. 8 (1970) 153-155.

Ishikawa, R.; Kikuchi, M., Photovoltaic Study on the Photo-enhanced Diffusion of Ag in Amorphous Films of Ge2S3, J. Non-Cryst. Solids 35 & 36 (1980) 1061-1066.

Iyetomi, H.; Vashishta, P.; Kalia, R.K., Incipient Phase Separation in Ag/Ge/Se Glasses: Clustering of Ag Atoms, J. Non-Cryst. Solids 262 (2000) 135-142.

Jones, G.; Collins, R.A., Switching Properties of Thin Selenium Films Under Pulsed Bias, Thin Solid Films 40 (1977) L15-L18.

Joullie, A.M.; Marucchi, J., On the DC Electrical Conduction of Amorphous As2Se7 Before Switching, Phys. Stat. Sol. (a) 13 (1972) K105-K109.

Joullie, A.M.; Maruccchl, J., Electrical Properties of the Amorphous Alioy As2Se5, Mat. Res. Bull. 8 (1973) 433-441.

Kaplan, T.; Adler, D., Electrothermal Switching in Amorphous Semiconductors, J. Non-Cryst. Solids 8-10 (1972) 538-543.

Kawaguchi et al., *Mechanism of Photosurface Deposition*, 164-166 J. Non-Cryst. Solids, pp. 1231-1234 (1993).

Kawaguchi, T.; Maruno, S.; Elliott, S.R., Optical, Electrical, and Structural Properties of Amorphous Ag-Ge-S and Ag-Ge-Se Films and Comparison of Photoinduced and Thermally Induced Phenomena of Both Systems, J. Appl. Phys. 79 (1996) 9096-9104.

Kawaguchi, T.; Masui, K., Analysis of Change in Optical Ttransmission Spectra Resulting from Ag Photodoping in Chalcogenide Film, Japn. J. Appl. Phys. 26 (1987) 15-21.

Kawamoto, Y., Nishida, M., Ionic Condition in As2S3—Ag2S, GeS2—GeS—Ag2S and P2S5-Ag2S Glasses, J. Non-Cryst Solids 20 (1976) 393-404.

Kawasaki, M.; Kawamura, J.; Nakamura, Y.; Aniya, M., Ionic Conductivity of Agx(GeSe3)1−x (0<=x<=0.571) Glasses, Solid State Ionics 123 (1999) 259-269.

Kluge, G.; Thomas, A.; Klabes, R.; Grotzschel, R., Suptitz, P. Silver Photodiffusion in Amorphous GexSe100-x, J. Non-Cryst. Solids 124 (1990) 185-193.

Kolobov, A.V., On the Origin of P-type Conductivity in Amorphous Chalcogenldes, J. Non-Cryst. Solids 198-200 (1996) 728-731.

Kolobov, A.V., Lateral Diffusion of Silver in Vitreous Chalcogenide Films, J. Non-Cryst. Solids 137-138 (1991) 1027-1030.

Kolobov et al., Photodoping of Amorphous Chalcogenides by Metals, Advances in Physics, 1991, vol. 40, No. 5, pp. 625-684.

Korkinova, Ts.N.; Andreichin, R.E., Chalcogenide Glass Polarization and the Type of Contacts, J. Non-Cryst. Solids 194 (1996) 258-259.

Kotkata, M.F.; Afifi M.A.; Labib, H.H.; Hegab, N.A.; Abdel-Aziz, M.M., Memory Switching in Amorphous GeSeTI Chalcogenide Semiconductor Films, Thin Solid Films 240 (1994) 143-146.

Kozicki et al., Silver Incorporation in Thin Films of Selenium Rich Ge-Se Glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes in Metal-doped Chalcogenides, Electrochemical Sciciety Proceedings, vol. 99-13, 1999, pp. 298-309.

Kozicki et al., Nanoscale Effects in Devices Based on Chalcogenide Solid Solutions, Superlattices and Microstructures, vol. 27, No. 5/6, 2000, pp. 485-488.

Kozicki et al., Nanoscale Phase Separation in Ag-Ge-Se Glasses, Microelectronic Engineering 63 (2002) pp. 155-159.

Lakshminarayan, K.N.; Srivastava, K.K.; Panwar, O.S.; Kumar, A., Amorphous Semiconductor Devices: Memory and Switching Mechanism, J. Instn Electronics & Telecom. Engrs 27 (1981) 16-19.

Lal, M.; Goyal, N., Chemical Bond Approach to Study the Memory and Threshold Switching Chalcogenide Glasses, Indian Journal of Pure & Appl. Phys. 29 (1991) 303-304.

Leimer, F.; Stotzel. H.; Kottwitz, A., Isothermal Electrical Polarisation of Amorphous GeSe Films with Blocking Al Contacts Influenced by Poole-Frenkel Conduction, Phys. Stat. Sol. (a) 29 (1975) K129-K132.

Leung, W.; Cheung, N.; Neureuther, A.R., Photoinduced Diffusion of Ag in GexSe1−x Glass, Appl. Phys. Lett. 46 (1985) 543-545.

Matsushita, T.; Yamagami, T.; Okuda, M., Polarized Memory Effect Observed on Se-SnO2 System, Jap. J. Appl. Phys. 11 (1972) 1657-1662.

Matsushita, T.; Yamagami, T.; Okuda, M., Polarized Memory Effect Observed on Amorphous Selenium Thin Films, Jpn. J. Appl. Phys. 11 (1972) 606.

Mazurier, F.; Levy, M.; Souquet, J.L, Reversible and Irreversible Electrical Switching in TeO2-V2O5 Based Glasses, Journal de Physique IV 2 (1992) C2-185-C2-188.

McHardy et al., The Dissolution of Metals in Amorphous Chalcogenides and the Effects of Electron and Ultraviolet Radiation, 20 J. Phys. C.: Solid State Phys., pp. 4055-4075 (1987).

Messoussi, R.; Bernede, J.C.; Benhida, S.; Abachi, T.; Latef, A., Electrical Characterization of M/Se Structures (M=Ni,Bi), Mat. Chem. and Phys. 28 (1991) 253-258.

Mitkova, M.; Boolchand, P., Microscopic Origin of the Glass Forming Tendency in Chalcohalides and Constraint Theory, J. Non-Cryst. Solids 240 (1998) 1-21.

Mitkova. M.; Kozicki, M.N., Silver Incorporation in Ge-Se Glasses Used in Programmable Metallization Cell Devices, J. Non-Cryst. Solids 299-302 (2002) 1023-1027.

Mitkova, M.; Wang, Y.; Boolchand, P., Dual Chemical Role of Ag as an Additive in Chalcogenide Glasses, Phys. Rev. Lett. 83 (1999) 3848-3852.

Miyatani, S.-y., Electronic and Ionic Conduction in (AgxCu1−x)2Se, J. Phys. Soc. Japan 34 (1973) 423-432.

Miyatani, S.-y., Electrical Properties of Ag2Se, J. Phys. Soc. Japan 13 (1958) 317.

Miyatani, S.-y., Ionic Conduction in Beta-Ag2Te and Beta-Ag2Se, Journal Phys. Soc. Japan 14 (1959) 996-1002.

Mott, N. F., Conduction in Glasses Containing Transition Metal Ions, J. Non-Cryst. Solids 1 (1968) 1-17.

Nakayama. K.; Kitagawa, T.; Ohmura, M.; Suzuki, M., Nonvolatile Memory Based on Phase Transition in Chalcogenide Thin Films, Jpn. J. Appl. Phys. 32 (1993) 564-569.

Shimizu et al., *The Photo-Erasable Memory Switching Effect of Ag Photo-Doped Chalcogenide Glasses*, 46 B. Chem Soc. Japan, No. 12, pp. 3662-3665 (1973).

Snell, A.J.; Lecomber, P.G.; Hajto, J.; Rose, M.J.; Owen, A.E.; Osborne, I.S., Analogue Memory Effects in Metal/a-Si:H/metal Memory Devices, J. Non-Cryst. Solids 137-138 (1991) 1257-1262.

Snell, A.J.; Hajto, J.;Rose, M.J.; Osborne, I.S.; Holmes, A.; Owen, A.E.; Gibson, R.A.G., Analogue Memory Effects in Metal/a-Sl:H/metal Thin Film Structures, Mat. Res. Soc. Symp. Proc. V 297, 1993, 1017-1021.

Steventon, A.G., Microfilaments in Amorphous Chalcogenide Memory Devices, J. Phys. D: Appl. Phys. 8 (1975) L120-L122.

Steventon, A.G., The Switching Mechanisms in Amorphous Chalcogenide Memory Devices, J. Non-Cryst. Solids 21 (1976) 319-329.

Stocker, H.J., Bulk and Thin Film Switching and Memory Effects in Semiconducting Chalcogenide Glasses, App. Phys. Lett. 15 (1969) 55-57.

Tanaka, K., Ionic and Mixed Conductions in Ag Photodoping Process, Mod. Phys. Lett B 4 (1990) 1373-1377.

Tanaka, K.; Iizima, S.; Sugi, M.; Okada, Y.; Kikuchi, M., Thermal Effect on Switching Phenomenon in Chalcogenide Amorphous Semiconductors, Solid State Comm. 8 (1970) 387-389.

Thornburg, D.D., Memory Switching in a Type I Amorphous Chalcogenide, J. Elect. Mat. 2 (1973) 3-15.

Thornburg, D.D., Memory Switching in Amorphous Arsenic Triselenide, J. Non-Cryst. Solids 11 (1972) 113-120.

Thornburg. D.D.; White. R.M., Electric Field Enhanced Phase Separation and Memory Switching in Amorphous Arsenic Triselenide, Journal (1972) 4609-4612.

Tichy, L.; Ticha, H., Remark on the Glass-forming Ability in GexSe1−x and AsxSe1−x Systems, J. Non-Cryst. Solids 261 (2000) 277-281.

Titus, S.S.K.; Chatterjee, R.; Asokan, S., Electrical Switching and Short-range Order in As-Te Glasses, Phys. Rev. B 48 (1993) 14650-14652.

Tranchant,S.;Peytavin,S.;Ribes,M.;Flank,A.M.;Dexpert,H.;Lagarde.J.P., Silver Chalcogenide Glasses Ag-Ge-Se: Ionic Conduction and Exafs Structural Investigation, Transport-structure Relations in Fast Ion and Mixed Conductors Proceedings of the 6th Riso International Symposium. Sep. 9-13, 1985, pp. 425-430.

Tregouet, Y.; Bernede, J.C., Silver Movements in Ag2Te Thin Films: Switching and Memory effects, Thin Solid Films 57 (1979) 49-54.

Uemura, O.; Kameda, Y.; Kokai, S.; Satow, T., Thermally Induced Crystallization of Amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric Field Induced Filament Formation in As-Te-Ge Glass, J. Non-Cryst. Solids 2 (1970) 358-370.

Viger. C.; Lefrancois, G.; Fleury, G., Anomalous Behaviour of Amorphous Selenium Films, J. Non-Cryst. Solids 33 (1996) 287-272.

Vodenicharov, C.; Parvanov,S.; Petkov,P., Electrode-limited Currents in the Thin-film M-GeS-M System, Mat. Chem. and Phys. 21 (1989) 447-454.

Wang, S.-J.; Misium, G.R.; Camp, J.C.; Chen, K.-L.; Tigelaar, H.L., High-performance Metal/silicide Antifuse, IEEE Electron Dev. Lett. 13 (1992) 471-472.

Weirauch, D.F., Threshold Switching and Thermal Filaments in Amorphous Semiconductors, App. Phys. Lett. 16 (1970) 72-73.

West, W.C.; Sieradzki, K.; Kardynal, B.; Kozicki, M.N., Equivalent Circuit Modeling of the Ag|As0.24S0.36Ag0.40|Ag System Prepared by Photodissolution of Ag, J. Electrochem. Soc. 145 (1998) 2971-2974.

West, W.C., Electrically Erasable Non-volatile Memory Via Electrochemical Deposition of Multifractal Aggregates, Ph.D. Dissertation, ASU 1998, 189 pages.

Zhang, M.; Mancini, S.; Bresser, W.; Boolchand, P., Variation of Glass Transition Temperature, Tg, with Average Coordination Number, <m>, in Network Glasses: Evidence of a Threshold Behavior in the Slope |dTg/d<m>| at the Rigidity Percolation Threshold (<m>=2.4), J. Non-Cryst. Solids 151 (1992) 149-154.

Written Opinion of the International Searching Authority, Mar. 12, 2009.

International Search Report, Feb. 15, 2008.

Abdel-All, A.; Elshafie,A.; Elhawary, M.M., DC Electric-field Effect in Bulk and Thin-film Ge5As38Te57 Chalcogenide Glass, Vacuum 59 (2000) 845-853.

Adler, D.; Moss, S.C., Amorphous Memories and Bistable Switches, J. Vac. Sci. Technol. 9 (1972) 1182-1189.

Adler, D.; Henisch, H.K.; Mott, S.N., The Mechanism of Threshold Switching in Amorphous Alloys, Rev. Mod. Phys. 50 (1978) 209-220.

Afifi, M.A.; Labib, H.H.; El-Fazary, M.H.; Fadel, M., Electrical and Thermal Properties of Chalcogenide Glass System Se75Ge25-xSbx, Appl. Phys. A 55 (1992) 167-169.

Afifi,M.A.; Labib, H.H.; Fouad, S.S.; El-Shazly, A.A., Electrical & Thermal Conductivity of the Amorphous Semiconductor GexSe1−x, Egypt, J. Phys. 17 (1986) 335-342.

Alekperova, Sh.M.; Gadzhieva, G.S., Current-voltage Characteristics of Ag2Se Single Crystal Near the Phase Transition, Inorganic Materials 23 (1987) 137-139.

Aleksiejunas, A.; Cesnys, A., Switching Phenomenon and Memory Effect in Thin-film Heterojunction of Polycrystalline Selenium-silver Selenide, Phys. Stat. Sol. (a) 19 (1973) K169-K171.

Angell, C.A., Mobile Ions in Amorphous Solids, Annu. Rev. Phys. Chem. 43 (1992) 693-717.

Aniya, M., Average Electronegativity, Medium-range-order, and Ionic Conductivity in Superionic Glasses, Solid State Ionics 136-137 (2000) 1085-1089.

Asahara, Y.; Izumitani, T., Voltage Controlled Switching in Cu-As-Se Compositions, J. Non-Cryst. Solids 11 (1972) 97-104.

Asokan, S.; Prasad, M.V.N.; Parthasarathy, G.; Gopal, E.S.R., Mechanical and Chemical Thresholds in IV-VI Chalcogenide Glasses, Phys. Rev. Lett. 62 (1989) 808-810.

Axon Technologies Corporation, Technology Description: *Programmable Metalization Cell (PMC)*, pp. 1-6 (pre-May 2000).

Baranovskii, S.D.; Cordes, H., On the Conduction Mechanism in Ionic Glasses, J. Chem. Phys. 111 (1999) 7546-7557.

Belin, R.; Taillades, G.; Pradel, A.; Ribes, M., Ion Dynamics in Superionic Chalcogenide Glasses: CompleteConductivity Spectra, Solid State Ionics 136-137 (2000) 1025-1029.

Belin, R.; Zerouale, A.; Pradel, A.; Ribes, M., Ion Dynamics in the Argyrodite Compound Ag7GeSe5I: Non-Arrhenius Behavior and Complete Conductivity Spectra, Solid State Ionics, 143 (2001) 445-455.

Chen, C.H.; Tai, K.L. , Whisker Growth Induced by Ag Photodoping in Glassy GexSe1−x Films, Appl. Phys. Lett. 37 ((80) 1975-1077.

Chen, G.; Ch eng, J., Role of Nitrogen in the Crystallization of Silicon Nitride-doped Chalcogenide Glasses, J. Am. Ceram. Soc. 82 (1999) 2934-2936.

Chen, G.; Cheng, J.; Chen, W., Effect of Si3N4 on Chemical Durability of Chalcogenide Glass, J. Non-Cryst. Solids 220 (1997) 249-253.

Cohen, M.H.; Neale, R.G.; Paskin, A., A Model for an Amorphous Semiconductor Memory Device, J. Non-Cryst. Solids 8-10 (1972) 885-891.

Croitoru, N.; Lazarescu, M.; Popescu, C.; Telnic, M.; and Vescan, L., Ohmic and Non-ohmic Conduction in Some Amorphous Semiconductors, J. Non-Cryst. Solids 8-10 (1972) 781-786.

Dalven, R.; Gill, R., Electrical Properties of Beta-Ag2Te and Beta-Ag2Se From 4.2° to 300° K, J. Appl. Phys. 38 (1967) 753-756.

Davis, E.A., Semiconductors Without Form, Search 1 (1970) 152-155.

Dearnaley, G.; Stoneham, A.M.; Morgan, D.V., Electrical Phenomena in Amorphous Oxide Films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold Switching in Hydrogenated Amorphous Silicon, Appl. Phys. Lett. 40 (1982) 812-813.

Drusedau, T.P.; Panckow, A.N.; Klabunde, F., The Hydrogenated Amorphous Silicon/nanodisperse Metal (SIMAL) System-Films of Unique Electronic Properties, J. Non-Cryst. Solids 198-200 (1996) 829-832.

El Bouchairi, B.; Bernede, J.C.; Burgaud, P., Properties of Ag2-xSe1+x/n-Si Diodes, Thin Solid Films 110 (1983) 107-113.

El Gharras, Z.; Bourahla, A.; Vautier, C., Role of Photoinduced Defects in Amorphous GexSe1−x Photoconductivity, J. Non-Cryst. Solids 155 (1993) 171-179.

El Ghrandi, R.; Calas, J.; Galibert, G.; Averous, M., Silver Photodissolution in Amorphous Chalcogenide Tthin Films, Thin Solid Films 218 (1992) 259-273.

El Ghrandi, R.; Calas, J.; Galibert, G., Ag Dissolution Kinetics in Amorphous GeSe5.5 Thin Films from "In-situ" Resistance Measurements vs. Time, Phys. Stat. Sol. (a) 123 (1991) 451-460.

El-kady, Y.L., The Threshold Switching in Semiconducting Glass Ge21Se17Te62, Indian J. Phys. 70A (1996) 507-516.

Elliott, S.R., A Unified Mechanism for Metal Photodissolution in Amorphous Chalcogenide Materials, J. Non-Cryst. Solids 130 (1991) 85-97.

Elliott, S.R., Photodissolution of Metals in Chalcogenide Glasses: A Unified Mechanism, J. Non-Cryst. Solids 137-138 (1991) 1031-1034.

Elsamanoudy, M.M.; Hegab, N. A.; Fadel, M., Conduction Mechanism in the Pre-switching State of Thin Films Containing Te As Ge Si, Vacuum 46 (1995) 701-707.

El-Zahed, H.; El-Korashy, A., Influence of Composition on the Electrical and Optical Properties of Ge20BixSe80-x Films, Thin Solid Films 376 (2000) 236-240.

Fadel, M., Switching Phenomenon in Evaporated Se-Ge-As Thin Films of Amorphous Chalcogenide Glass, Vacuum 44 (1993) 851-855.

Fadel, M.; El-Shair, H.T., Electrical, Thermal and Optical Properties of Se75Ge7Sb18, Vacuum 43 (1992) 253-257.

Feng, X. Bresser, W.J.; Boolchand, P., Direct Evidence for Stiffness Threshold in Chalcogenide Glasses, Phys. Rev. Lett. 78 (1997) 4422-4425.

Feng, X. Bresser, W.J.; Zhang, M.; Goodman, B.; Boolchand, P., Role of Network Connectivity on the Elastic, Plastic and Thermal Behavior of Covalent Glasses, J. Non-Cryst. Solids 222 (1997) 137-143.

Fischer-Colbrie, A.; Bienenstock, A.; Fuoss, P.H.; Marcus, M.A., Structure and Bonding in Photodiffused Amorphous Ag-GeSe2 Thin Films, Phys. Rev. B 38 (1988) 12388-12403.

Fleury, G.; Hamou, A.; Viger, C.; Vautier, C., Conductivity and Crystallization of Amorphous Selenium, Phys. Stat. Sol. (a) 64 (1981) 311-316.

Fritzsche, H, Optical and Electrical Energy Gaps in Amorphous Semiconductors, J. Non-Cryst. Solids 6 (1971) 49-71.

Fritzsche, H., Electronic Phenomena in Amorphous Semiconductors, Annual Review of Materials Science 2 (1972) 697-744.

Gates, B.; Wu, Y.; Yin, Y.; Yang, P.; Xia, Y., Single-crystalline Nanowires of Ag2Se can be Synthesized by Templating Against Nanowires of Ttrigonal Se, J. Am. Chem. Soc. (2001) currently ASAP.

Gosain, D.P.; Nakamura, M.; Shimizu, T.; Suzuki, M.; Okano, S., Nonvolatile Memory Based on Reversible Phase Transition Phenomena in Telluride Glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation Creep of Ge-Se Chalcogenide Glasses Below Tg: Elastic Recovery and Non-Newtonian Flow, J. Non-Cryst. Solids 298 (2002) 260-269.

Guin, J.-P.; Rouxel, T.; Sangleboeuf, J.-C; Melscoet, I.; Lucas, J., Hardness, Toughness, and Scratchability of Germanium-selenium Chalcogenide Glasses, J. Am. Ceram. Soc. 85 (2002) 1545-52.

Gupta, Y.P., On Electrical Switching and Memory Effects in Amorphous Chalcogenides, J. Non-Cryst. Sol. 3 (1970) 148-154.

Haberland, D.R.; Stiegler, H., New Experiments on the Charge-controlled Switching Effect in Amorphous Semiconductors, J. Non-Cryst. Solids 8-10 (1972) 408-414.

Haifz, M.M.; Ibrahim, M.M.; Dongol, M.; Hammad, F.H., Effect of Composition on the Structure and Electrical Properties of As-Se-Cu Glasses, J. Apply. Phys. 54 (1983) 1950-1954.

Hajto, J.; Rose, M.J.; Osborne, I.S.; Snell, A.J.; Le Comber, P.G.; Owen, A.E., Quantization Effects in Metal/a-Si:H/metal Devices, Int. J. Electronics 73 (1992) 911-913.

Hajto, J.; Hu, J.; Snell, A.J.; Turvey, K.; Rose, M., DC and AC Measurements on Metal/a-Si:H/metal Room Temperature Quantised Resistance Devices, J. Non-Cryst. Solids 266-269 (2000) 1058-1061.

Hajto, J.; McAuley, B.; Snell, A.J.; Owen, A.E., Theory of Room Temperature Quantized Resistance Effects in Metal-a-Si:H-metal Thin Film Structures, J. Non-Cryst. Solids 198-200 (1996) 825-828.

Hajto, J.; Owen, A.E.; Snell, A.J.; Le Comber, P.G.; Rose, M.J., Analogue Memory and Ballistic Electron Effects in Metal-amorphous Silicon Structures, Phil. Mag. B 63 (1991) 349-369.

Hayashi, T.; Ono, Y.; Fukaya, M.; Kan, H., Polarized Memory Switching in Amorphous Se Film, Japan. J. Appl. Phys. 13 (1974) 1163-1164.

Hegab, N. A.; Fadel, M.; Sedeek, K., Memory Switching Phenomena in Thin Films of Chalcogenide Semiconductors, Vacuum 45 (1994) 459-462.

Helbert et al., *Intralevel Hybrid Resist Process with Submicron Capability*, SPIE vol. 333 Submicron Lithography, pp. 24-29 (1982).

Hilt, Dissertation: *Materials Characterization of Silver Chalcogenide Programmable Metalization Cells*, Arizona State University, pp. Title p. 114 (UMI Company, May 1999).

Hirose et al., *High Speed Memory Behavior and Reliability of an Amorphous $As_2S_3$ Film Doped* with *Ag*, Phys. Stat. Sol. (a) 61, pp. 87-90 (1980).

Hirose, Y.; Hirose, H., Polarity-dependent Memory Switching and Behavior of Ag Dendrite in Ag-photodoped Amorphous As2S3 Films, J. Appl. Phys. 47 (1976) 2767-2772.

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Nakayama, K.; Kojima, K.; Hayakawa, F.; Imai, Y.; Kitagawa, A.; Suzuki, M., Submicron Nonvolatile Memory Cell Based on Reversible Phase Transition in Chalcogenide Glasses, Jpn. J. Appl. Phys. 39 (2000) 6157-6161.

Nang, T.T.; Okuda, M.; Matsushita, T.; Yokota, S.; Suzuki, A., Electrical and Optical Properties of GexSe1−x Amorphous Thin Films, Jap. J. App. Phys. 15 (1976) 849-853.

Narayanan, R.A.; Asokan, S.; Kumar, A., Evidence Concerning the Effect of Topology on Electrical Switching in Chalcogenide Network Glasses, Phys. Rev. B 54 (1996) 4413-4415.

Neale, R.G.; Aseltine, J.A., The Application of Amorphous Materials to Computer Memories, IEEE Transactions on Electron Dev. Ed-20 (1973) 195-209.

Ovshinsky S.R.; Fritzsche, H., Reversible Structural Transformations in Amorphous Semiconductors for Memory and Logic, Metalurgical Transactions 2 (1971) 641-645.

Ovshinsky, S.R., Reversible Electrical Switching Phenomena in Disordered Structures, Phys. Rev. Lett. 21 (1968) 1450-1453.

Owen, A.E.; LeComber, P.G.; Sarrabayrouse, G.; Spear, W.E., New Amorphous-silicon Electrically Programmable Nonvolatile Switching Device, IEE Proc. 129 (1982) 51-54.

Owen, A.E.; Firth, A.P.; Ewen, P.J.S., Photo-induced Structural and Physico-chemical Changes in Amorphous Chalcogenide Semiconductors, Phil. Mag. B 52 (1985) 347-362.

Owen, A.E.; Le Comber, P.G.; Hajto, J.; Rose, M.J.; Snell, A.J., Switching in Amorphous Devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pattanayak, P.; Asokan, S., Signature of a Silver Phase Percolation Threshold in Microscopically Phase Separated Ternary $Ge_{0.15}Se_{0.85-x}Ag_x$ ($0 \leq x \leq 0.20$) Glasses, J. App. Phys. 97 (published online Dec. 13, 2004).

Pearson, A.D.; Miller, C.E., Filamentary Conduction in Semiconducting Glass Diodes, App. Phys. Lett. 14 (1969) 280-282.

Pinto, R.; Ramanathan, K.V., Electric Field Induced Memory Switching in Thin Films of the Chalcogenide System Ge-As-Se, Appl. Phys. Lett. 19 (1971) 221-223.

Popescu, C., The Effect of Local Non-uniformities on Thermal Switching and High Field Behavior of Structures with Chalcogenide Glasses, Solid-State Electronics 18 (1975) 671-681.

Popescu, C.; Croitoru, N., The Contribution of the Lateral Thermal Instability to the Switching Phenomenon, J. Non-Cryst. Solids 8-10 (1972) 531-537.

Popov, A.I.; Geller, I.KH.; Shemetova, V.K., Memory and Threshold Switching Effects in Amorphous Selenium, Phys. Stat. Sol. (a) 44 (1977) K71-K73.

Prakash, S.; Asokan, S.; Ghare, D.B., Easily Reversible Memory Switching in Ge-As-Te Glasses, J. Phys. D: Appl. Phys. 29 (1996) 2004-2008.

Rahman, S.; Sivarama Sastry, G., Electronic Switching in Ge-Bi-Se-Te Glasses, Mat. Sci. and Eng. B12 (1992) 219-222.

Ramesh, K.; Asokan, S.; Sangunni, K.S.; Gopal, E.S.R., Electrical Switching in Germanium Telluride Glasses Doped with Cu and Ag, Appl. Phys. A 69 (1999) 421-425.

Rose,M.J.;Hajto,J.;Lecomber,P.G.;Gage,S.M.;Choi,W.K.;Snell,A.J.;Owen,A.E., Amorphous Silicon Analogue Memory Devices, J. Non-Cryst. Solids 115 (1989) 168-170.

Rose,M.J.;Snell,A.J.;Lecomber,P.G.;Hajto,J.;Fitzgerald,A.G.;Owen,A.E., Aspects of Non-volatility in a -Si:H Memory Devices, Mat. Res. Soc. Symp. Proc. V 258, 1992, 1075-1080.

Schuocker, D.; Rieder, G., On the Reliability of Amorphous Chalcogenide Switching Devices, J. Non-Cryst. Solids 29 (1978) 397-407.

Sharma, A.K.; Singh, B., Electrical Conductivity Measurements of Evaporated Selenium Films in Vacuum, Proc. Indian Natn. Sci. Acad. 46, A, (1980) 362-368.

Sharma, R. P., Structural, Electrical and Optical Properties of Silver Selenide Films, Ind. J. of Pure and Applied Phys. 35 (1997) 424-427.

* cited by examiner

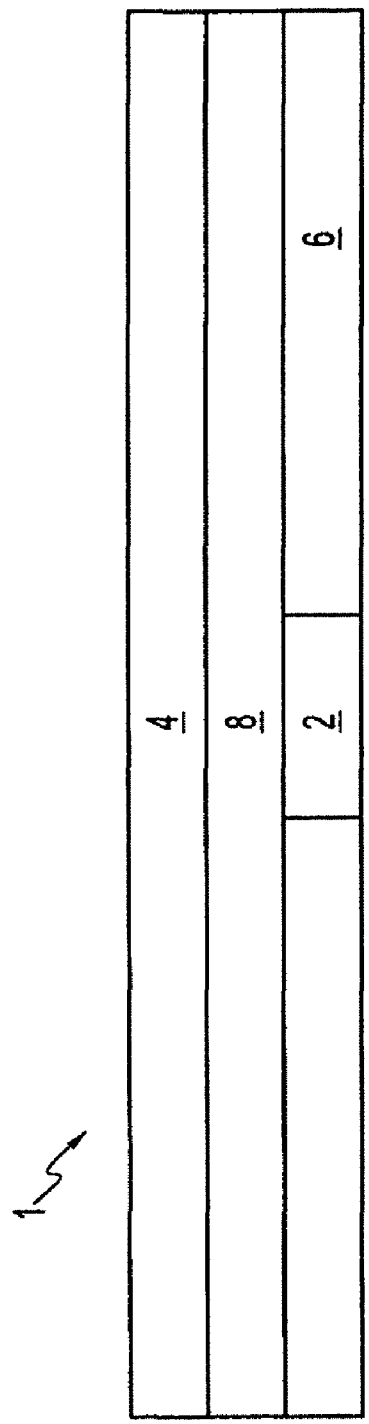
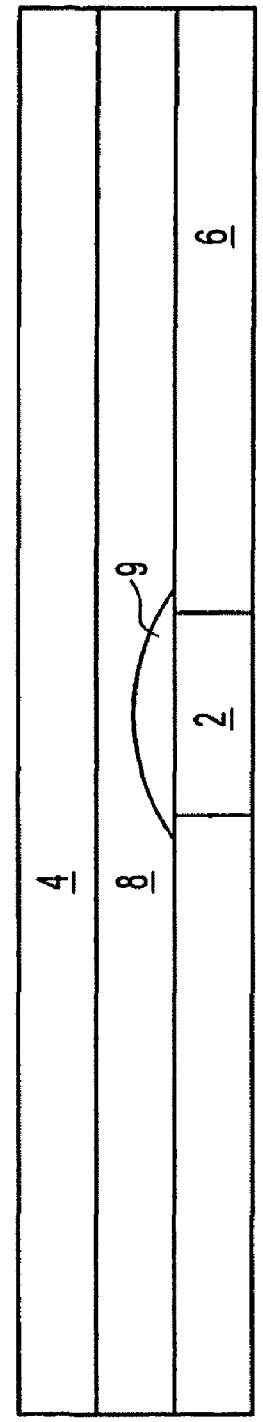

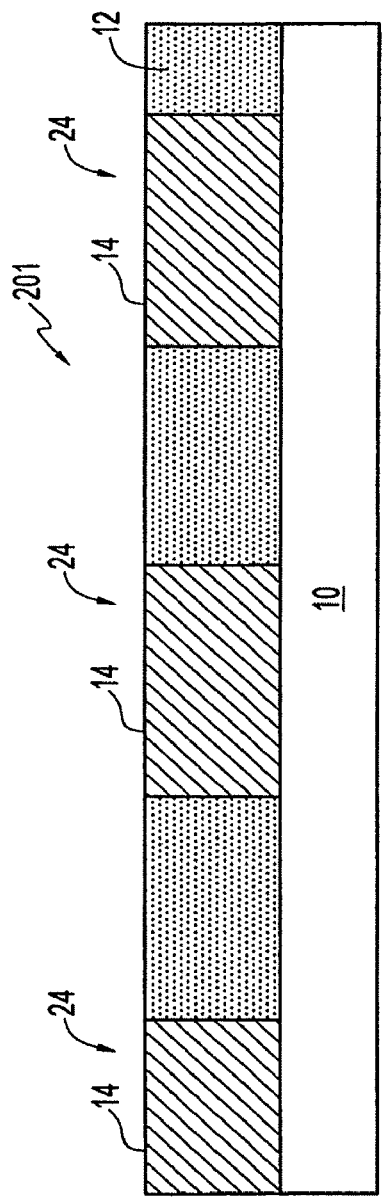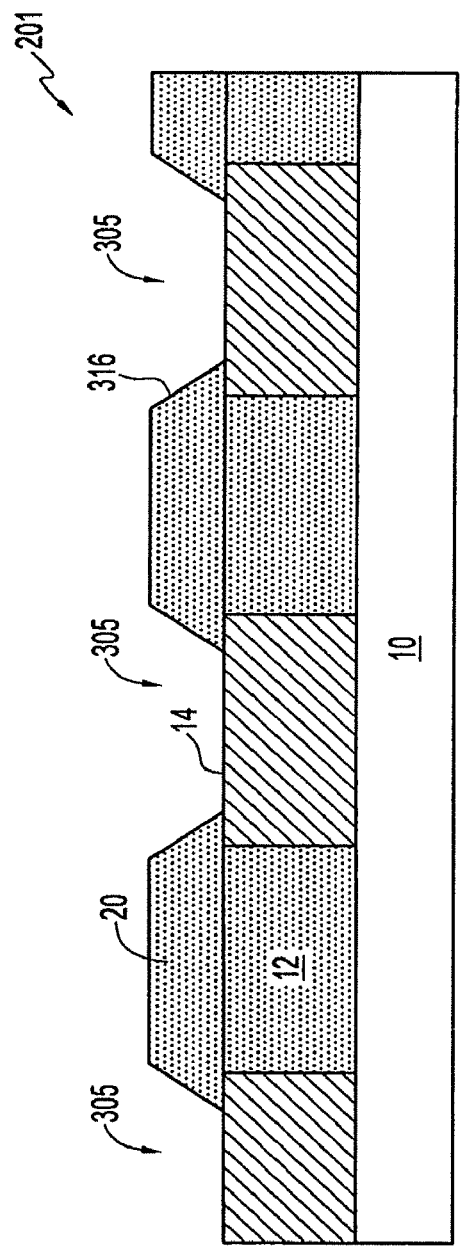

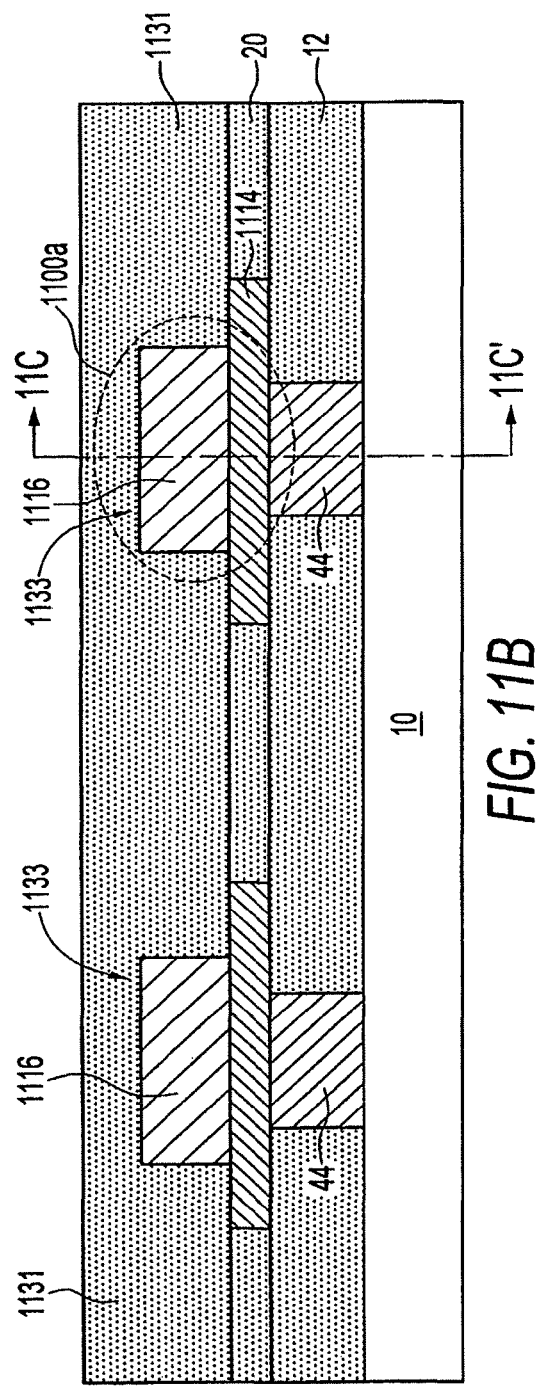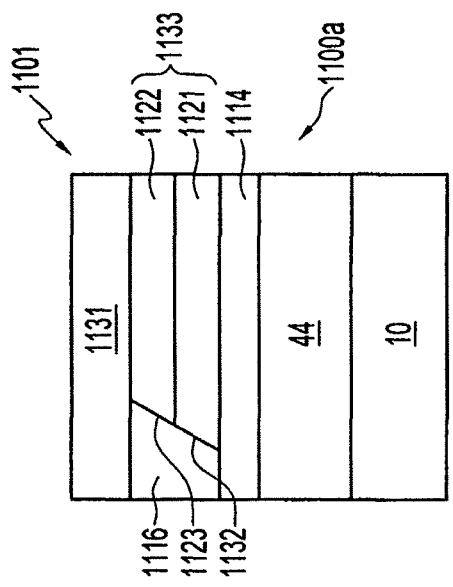
FIG. 11B
FIG. 11C ent of the invention;

ENHANCED MEMORY DENSITY RESISTANCE VARIABLE MEMORY CELLS, ARRAYS, DEVICES AND SYSTEMS INCLUDING THE SAME, AND METHODS OF FABRICATION

This application is a continuation of U.S. application Ser. No. 12/491,911, filed Jun. 25, 2009, now U.S. Pat No. 7,791,058 which is a divisional of U.S. application Ser. No. 11/511,311, filed Aug. 29, 2006, now U.S. Pat. No. 7,560,723 which are incorporated herein by reference in their entirety.

FIELD OF THE INVENTION

The invention relates to semiconductor devices and, in particular, to phase change memory elements and methods of forming and using the same.

BACKGROUND OF THE INVENTION

Non-volatile memories are useful elements of integrated circuits due to their ability to maintain data absent a power supply. Materials have been investigated for use in non-volatile memory cells. One class of programmable resistance materials are phase change materials, such as chalcogenide alloys, which are capable of stably transitioning between amorphous and crystalline phases. Each phase exhibits a particular resistance state and the resistance states distinguish the logic values of the memory element. Specifically, an amorphous state exhibits a relatively high resistance, and a crystalline state exhibits a relatively low resistance.

A conventional phase change memory element 1, illustrated in FIGS. 1A and 1B, has a layer of phase change material 8 between first and second electrodes 2, 4, which are supported by a dielectric material 6. The phase change material 8 is set to a particular resistance state according to the amount of current applied between the first and second electrodes 2, 4. To obtain an amorphous state (FIG. 1B), a relatively high write current pulse (a reset pulse) is applied through the conventional phase change memory element 1 to melt at least a portion 9 of the phase change material 8 covering the first electrode 2 for a first period of time. The current is removed and the phase change material 8 cools rapidly to a temperature below the crystallization temperature, which results in the portion 9 of the phase change material 8 covering the first electrode 2 having the amorphous state. To obtain a crystalline state (FIG. 1A), a lower current write pulse (a set pulse) is applied to the conventional phase change memory element 1 for a second period of time (typically longer in duration than the crystallization time of amorphous phase change material) to heat the amorphous portion 9 of the phase change material 8 to a temperature below its melting point, but above its crystallization temperature. This causes the amorphous portion 9 of the phase change material 8 to re-crystallize to the crystalline state that is maintained once the current is removed and the conventional phase change memory element 1 is cooled. The phase change memory element 1 is read by applying a read voltage, which does not change the phase state of the phase change material 8.

One drawback of phase change memory is the large programming current needed to achieve the phase change. This requirement leads to large access transistor design and large circuit layout with typical memory cells ranging in size from about 16F2 to 40F2. Accordingly, it is desirable to have phase change memory devices with reduced programming current requirements and increased bit density.

BRIEF DESCRIPTION OF THE DRAWINGS

The advantages and features of the invention will become more apparent from the detailed description of embodiments provided below with reference to the accompanying drawings in which:

FIGS. 1A and 1B illustrate a conventional phase change memory element;

FIGS. 3A-3D illustrate partial cross-sectional views of a method of fabricating the phase change memory device of FIGS. 2A and 2B;

FIGS. 11A-11C illustrate partial cross-sectional and partial top-down views of a phase change memory device according to another embodiment of the invention;

DETAILED DESCRIPTION OF THE INVENTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate or wafer in the following description, previous process steps may have been utilized to form regions or junctions in or over the base semiconductor or foundation. The substrate also need not be semiconductor-based, but may be any support structure suitable for supporting an integrated circuit, including, but not limited to, metals, alloys, glasses, polymers, ceramics, and any other supportive materials as is known in the art.

Embodiments of the invention provide phase change memory devices enabling increased bit density as compared to conventional devices.

The invention is now explained with reference to the figures, which illustrate embodiments and throughout which like reference numbers indicate like features.

Figure 2A:
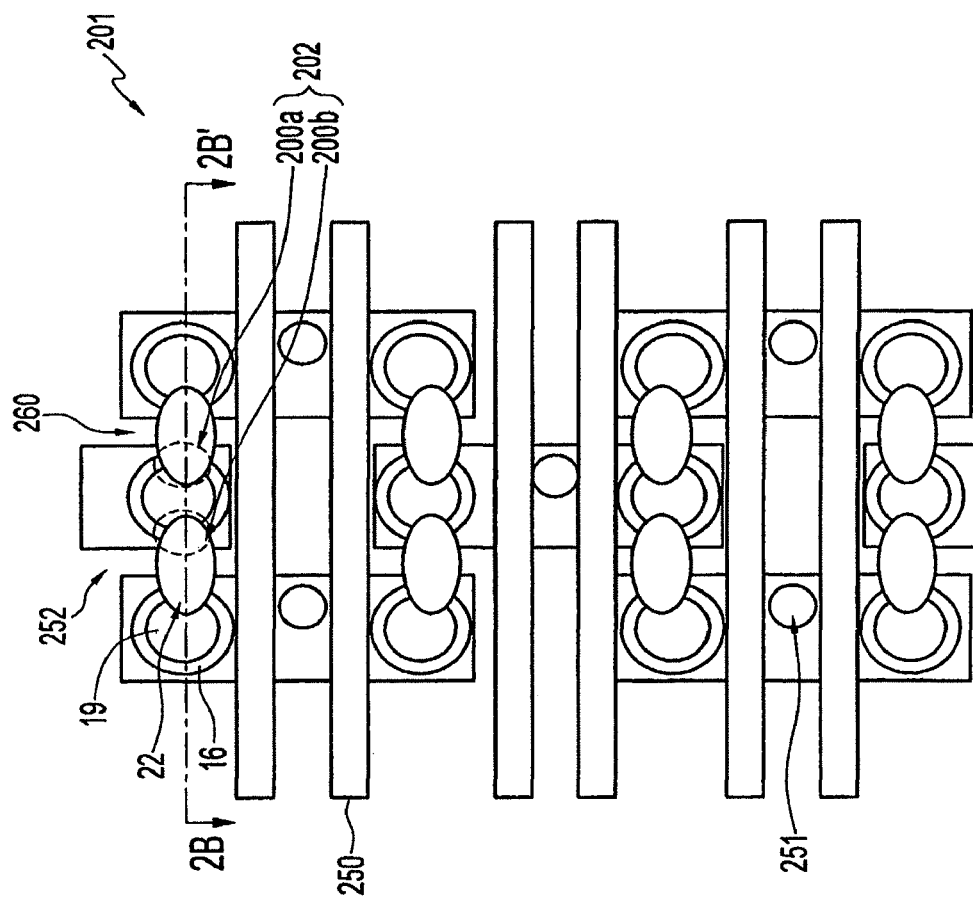
FIGS. 2A-2B illustrate partial cross-sectional and partial top-down, views, respectively, of a phase change memory device according to an embodiment of the invention.
Figure 2B:
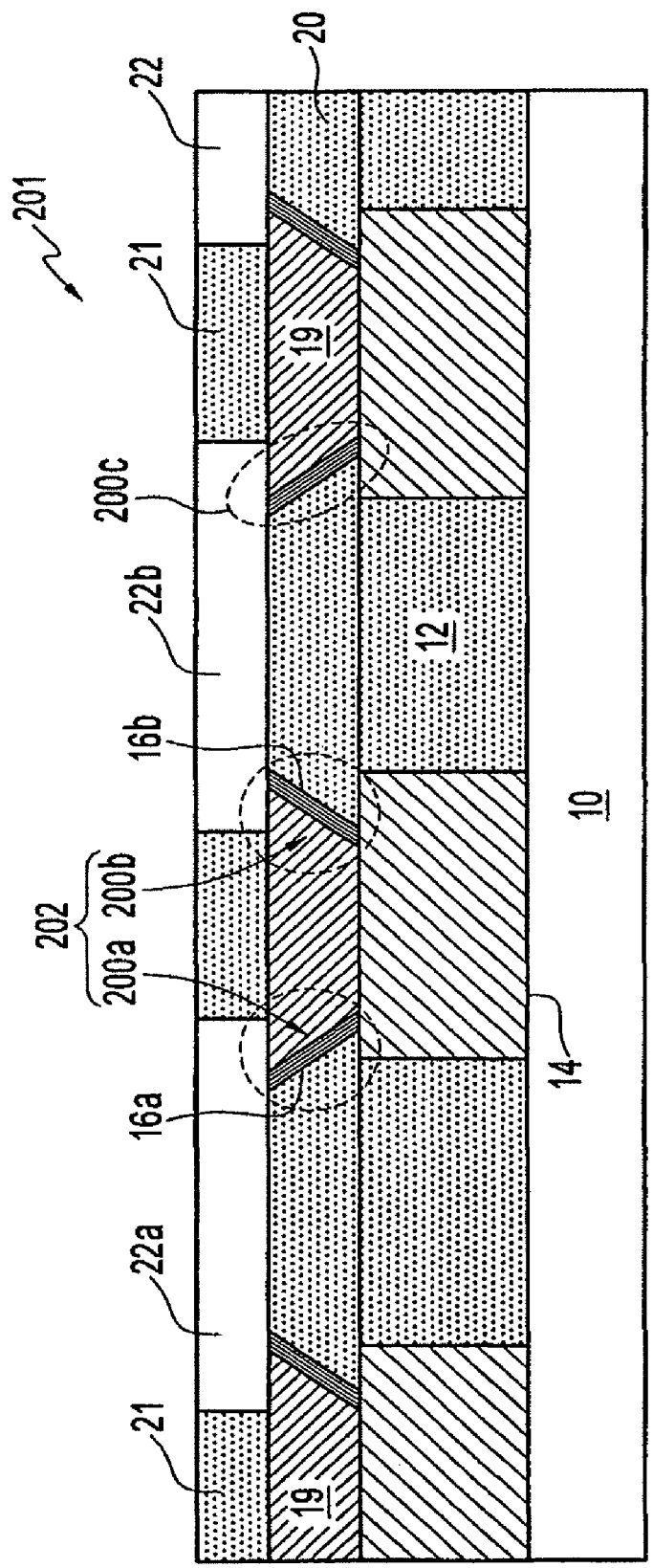

FIGS. 2A and 2B illustrate an embodiment of a portion of a resistance variable memory device 201 constructed in accordance with the invention. FIG. 2A is a top-down view of a portion of the memory device 201 and FIG. 2B is a cross-sectional view of the FIG. 2A device along the line 2B-2B'.

The memory device 201 is illustrated as a phase change memory device and includes a plurality of phase change memory elements 200a, 200b, 200c, each for storing at least one bit, i.e., logic 1 or 0. The memory elements 200a, 200b, 200c are supported by a substrate 10. A first dielectric layer 12 is formed on the substrate, and first electrodes 14 are formed within the first dielectric layer 12. The phase change memory device 201 also includes phase change material layers 16 formed over, and in electrical communication with, the first electrode 14. In the embodiment shown in FIG. 2B, the phase change material layers 16 are formed along a surface of a dielectric material 19 and within a second dielectric layer 20. As shown in FIG. 2A, the dielectric material 19 has a circular shape from a top-down perspective and the phase change material 16 has an annular shape from the top-down perspective. It should be understood that the dielectric material 19 can be formed to have a different shape, e.g., oval, square, among others, and therefore, the phase change material 16 can also be formed having a different shape. The phase change material layers 16 contact the bottom electrodes 14.

A third dielectric layer 21 is formed over the phase change material layers 16, the second dielectric layer 20 and the dielectric material 19. The second electrodes 22 are formed within the third dielectric layer 21.

The memory elements 200a, 200b, 200c correspond to where a first and second electrode and a portion of a phase change material layer 16 intersect electrically. Each first electrode 14 corresponds to a single memory cell 202 including two memory elements 200a, 200b. Thus, each first electrode 14 is associated with the two memory elements 200a, 200b. The memory element 200a is associated with a first, second electrode 22a and the memory element 200b is associated with a second, second electrode 22b. Thus, each memory cell 202 is associated with two different second electrodes, 22a, 22b.

In the illustrated embodiment, each second electrode 22 is also associated with two memory elements. For example, second electrode 22b is associated with memory elements 200b and 200c. Preferably, each second electrode is associated with memory elements 200b, 200c of different memory cells 202. Otherwise stated, a particular first electrode 14 and a particular second electrode 22 preferably are not associated with the same two memory elements 200a, 200b, 200c. This enables each individual memory element 200a, 200b, 200c to be selected by selecting the first and second electrodes 14, 22 that correspond to the particular element 200a, 200b, 200c.

As shown in FIGS. 2A and 2B, the second electrodes 22 are offset from the bottom electrodes 14 and each phase change material layer 16. Accordingly, the contact area of the phase change material layer 16 to the electrodes 14, 22 for each memory element 200a, 200b, 200c, is minimized. The programming volume of the memory elements 200a, 200b, 200c and the voltage needed to achieve the phase change for the memory elements 200a, 200b, 200c is also minimized. Additionally, as structures, such as the electrodes, 14, 22 and phase change material layers 16 are shared between memory elements 200a, 200b, 200c, the bit density of the device 201 can be increased over prior art devices, e.g., devices including the memory element 1 (FIG. 1). In particular, since each first electrode 14 is associated with two memory elements 200a, 200b, the bit density of the device 201 can be doubled as compared to a conventional memory device including memory elements 1 (FIG. 1).

Additional dielectric layers and contact and metal lines can also be included in the device 201. For example, as shown in FIG. 2A, word lines 250, digit line contacts 251, and metal lines 252 for connecting the second electrodes 22 are included in the device 201.

FIGS. 3A-3D illustrate an embodiment of a method of fabricating the phase change memory device 201 illustrated in FIGS. 2A and 2B. No particular order is required for any of the actions described herein, except for those logically requiring the results of prior actions. Accordingly, while the actions below are described as being performed in a specific order, the order can be altered if desired.

As shown in FIG. 3A a first dielectric layer 12 is formed over a substrate 10. The first dielectric layer 12 is etched to create vias 24 within which the first electrodes 14 are formed. The first electrodes 14 be formed of any suitable conductive material, such as titanium-nitride (TiN), titanium-aluminum-nitride (TiAlN), titanium-tungsten (TiW), platinum (Pt) or tungsten (W), among others. In the illustrated embodiment, the first electrodes 14 are formed having a substantially circular top-down shape (FIG. 2A), however the first electrodes may have any shape, such as a rectangle, circle, square or other shape.

As depicted in FIG. 3B, a second insulating layer 20 is formed over the first electrodes 14 and the first insulating layer 12. An opening 305 is formed over and aligned with each first electrode 14 by any suitable technique. The openings 305 are preferably formed having sloped sidewalls 316 to improve the step coverage of the phase change material deposition, discussed below. It should also be noted that sloped sidewalls 316 are only optional, and that the sidewalls 316 can instead be vertical relative to a top surface of the first electrode 14, linear, non-linear, bowed, or any other desired shape.

In the FIG. 2A-2B embodiment, the openings 305 are formed having a substantially circular top-down shape, however the openings 305 may have any shape.

Figure 3C:
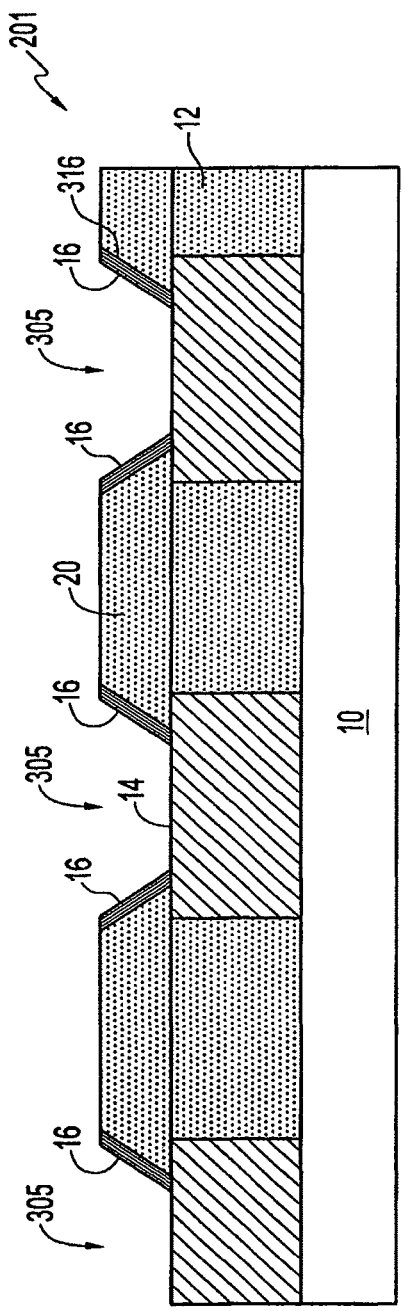

FIG. 3C illustrates the deposition of a conformal or a partially conformal phase change material layer 16 on the sidewalls 316 of openings 305. Any suitable techniques may be used to form the phase change material layer 16. In the illustrated embodiment, the deposited phase change material is a chalcogenide material, such as, for example, germanium-antimony-telluride and has a thickness of, for example, about 100 Å. The phase change material can also be or include one or more other phase change materials such as, for example, In—Se, Sb2Te3, GaSb, InSb, As—Te, Al—Te, GeTe, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt.

Although the thickness of the phase change material layer 16 on the sidewalls of the opening 305 is illustrated as being uniform, such a configuration is only one example of an implementation of the invention and is not limiting thereof. It should also be noted that the phase change material layer 16 need not completely cover the sidewalls 316 of each opening 305. For example, the phase change material layer 16 can only partially cover the sidewalls 316 to further reduce the volume of the phase change material layer 16 for a particular element 200a, 200b, 200c, which may further reduce the current necessary to switch the state of the phase change material layer 16.

Figure 3D:
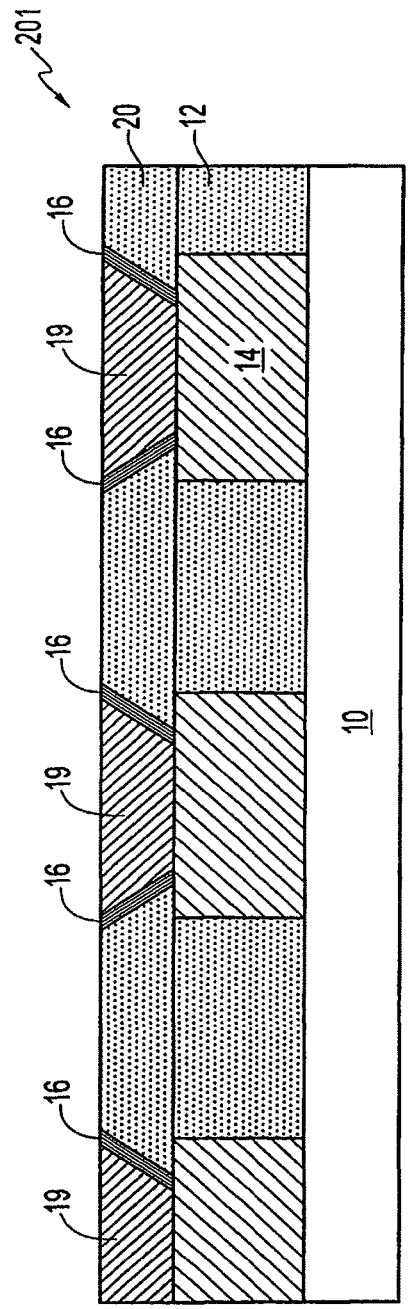

FIG. 3D illustrates the formation of a dielectric material 19 over the phase change material layer and filling the openings 305. In the illustrated embodiment, the dielectric material is an oxide. The dielectric material 19 can also be, for example, silicon nitrides; alumina oxides; high temperature polymers; low dielectric materials; insulating glass; or insulating polymers.

The dielectric material 19, phase change material layer 16 and second insulating layer 20 are subsequently planarized. The second electrodes 22 are then formed over the phase change material layer 16 and second insulating layer 20. The second electrodes 22 may be formed of any suitable conductive material, such as titanium-nitride (TiN), titanium-aluminum-nitride (TiAlN), titanium-tungsten (TiW), platinum (Pt) or tungsten (W), among others. In the illustrated embodiment, each second electrode 22 is formed over portions of at least two first electrodes 14 and in contact with a phase change material layer 16 formed on a portion of the sidewalls of at least two openings 305. In the illustrated embodiment, the second electrodes 22 are formed having a substantially oval top-down shape (FIG. 2A), however the second electrodes 22 may have any shape, such as a rectangle, circle, square or other shape.

Figure 4A:
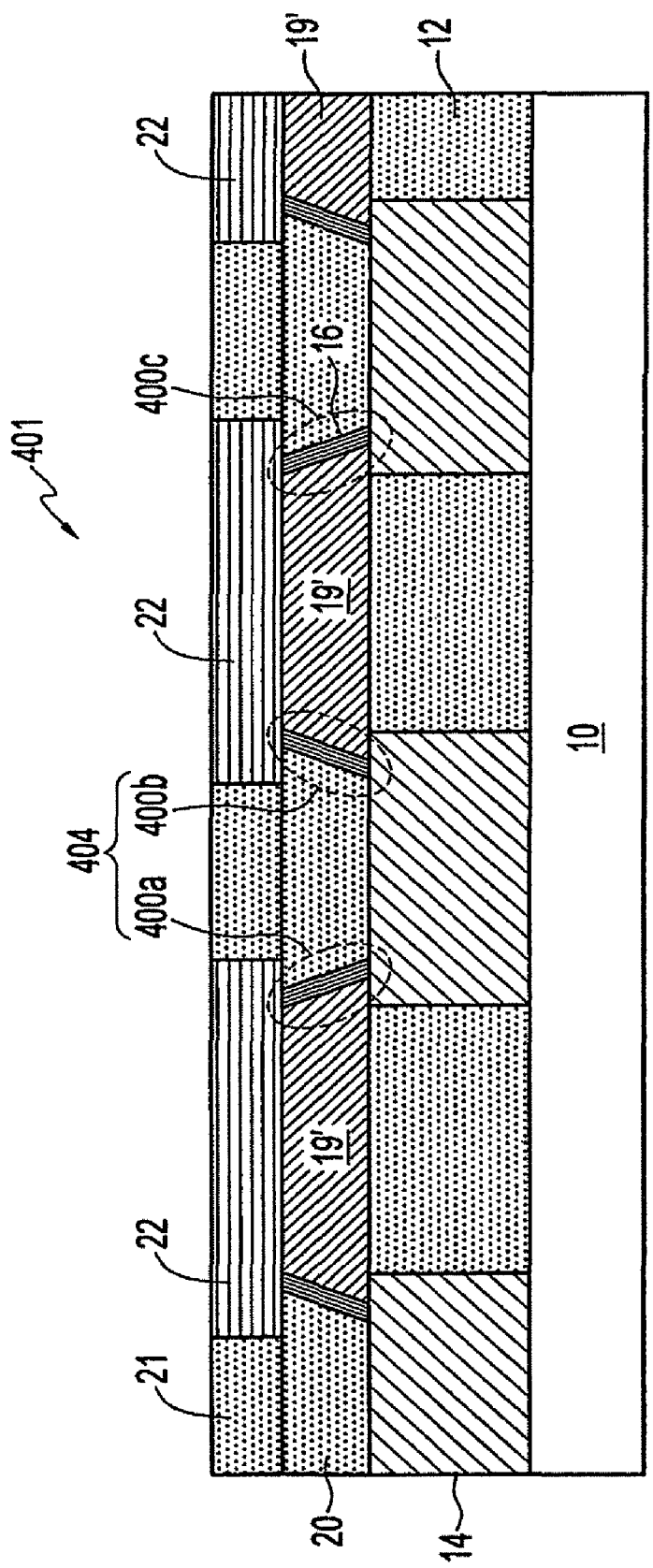
FIGS. 4A-4B illustrate partial cross-sectional views of a phase change memory device according to another embodiment of the invention.
Figure 4B:
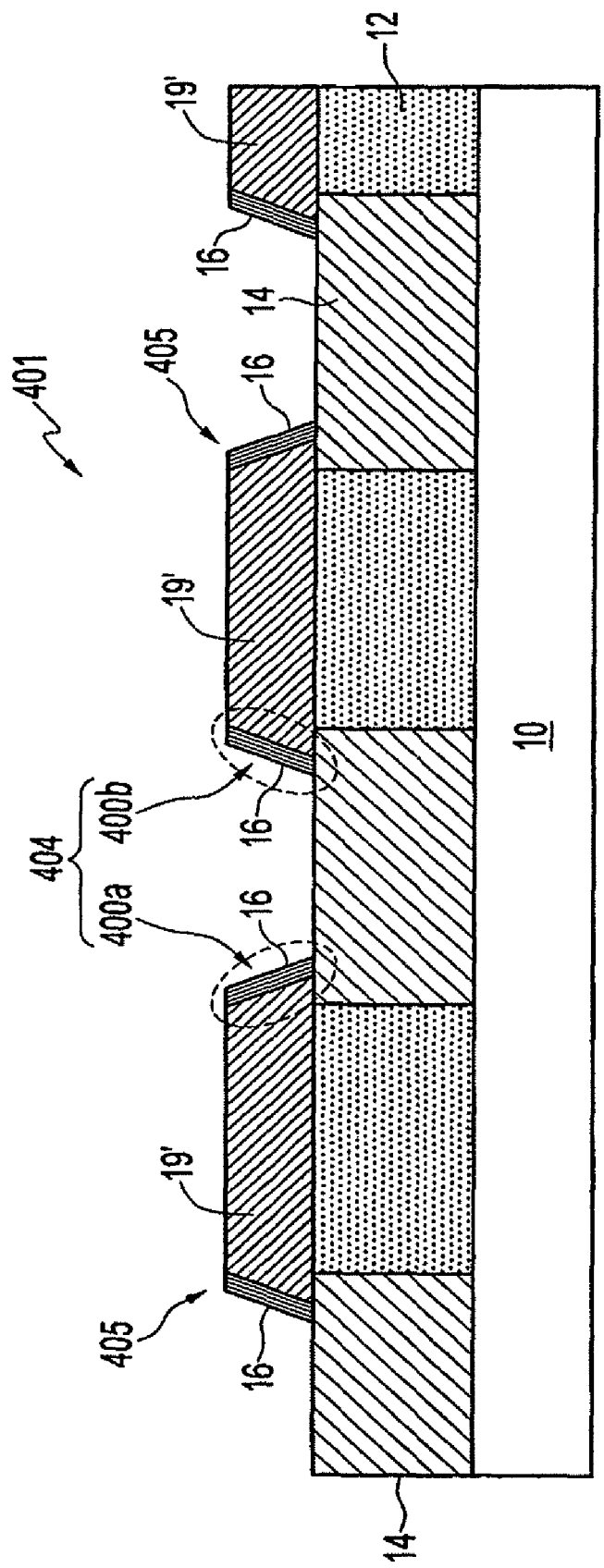

FIGS. 4A and 4B illustrate a phase change memory device 401 according to other embodiments of the invention. The device 401 includes memory cell 404, which includes two memory elements 400a, 400b. The phase change memory device 401 is similar to the phase change memory device 201 (FIGS. 2A-2B) except that the second electrodes 22 are aligned with the phase change material layers 16 and dielectric layers 19 and the bottom electrodes 14 are below portions of two phase change material layers 16 and dielectric layers 19. Additionally, the phase change material layers 16 are formed on sidewalls of dielectric mesas 19'. Thus, the phase change material layers 16 are sloped in opposite directions than those of the memory device 201 (FIGS. 2A-2B).

FIG. 4B shows the formation of the memory device 401 in accordance with embodiments of the invention. No particular order is required for any of the actions described herein, except for those logically requiring the results of prior actions. Accordingly, while the actions below are described as being performed in a specific order, they can be altered if desired.

The first electrodes 14 can be formed as described in connection with FIG. 3A above. As shown in FIG. 4B a mesa of dielectric material 19' is formed over the first dielectric layer 12. The dielectric mesa 19' is formed to overlie portions of two first electrodes 14. A layer 16 of phase change material is formed on the sidewalls of the dielectric mesa 19'. To achieve the structure shown in FIG. 4B, the dielectric mesa 19' is formed by, for example, patterning and etching a dielectric layer to form mesa using known photolithography and etching techniques.

As in the device 201 (FIGS. 2A-2B) the dielectric mesas 19' are substantially circular from a top-down perspective. Accordingly, the phase change material layers 16 are annular from a top-down perspective. The mesas 19' and phase change material layers 16, however, can have other shapes.

Figure 5A:
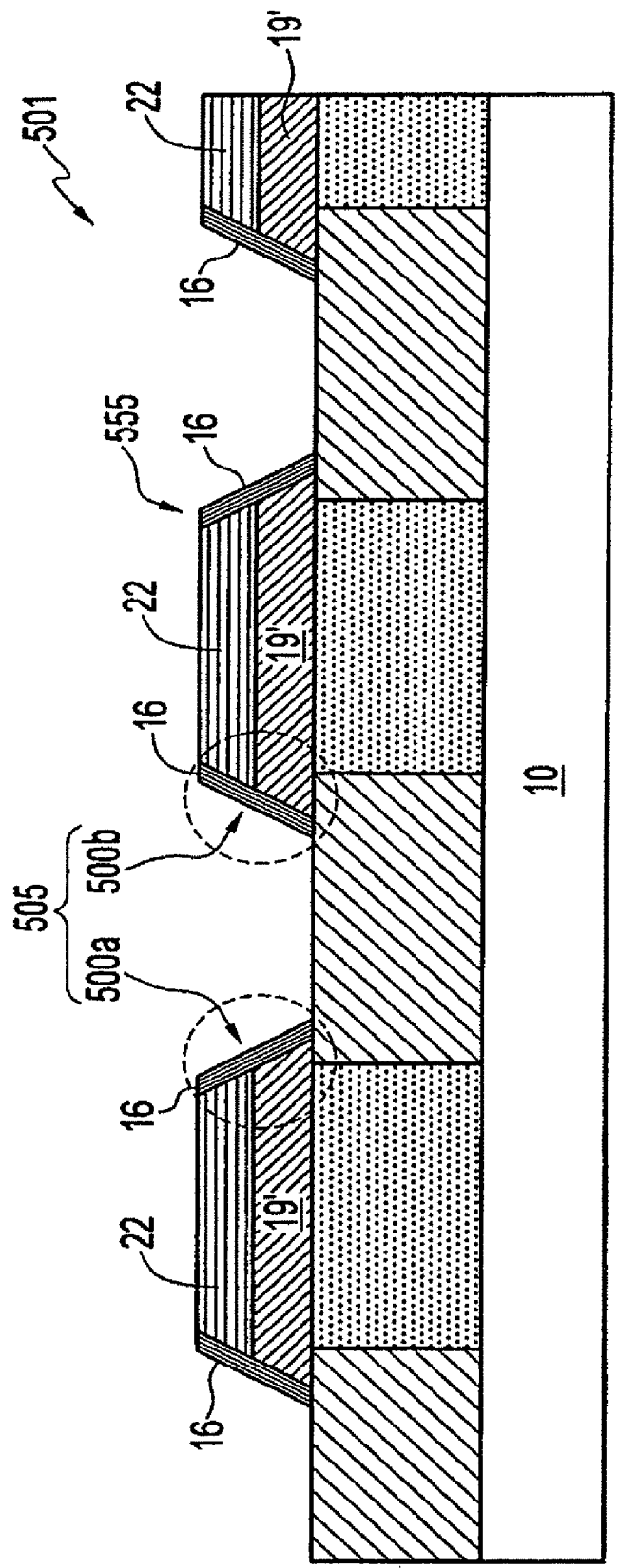
FIGS. 5A-5B illustrate partial cross-sectional views of a phase change memory device according to another embodiment of the invention.
Figure 5B:
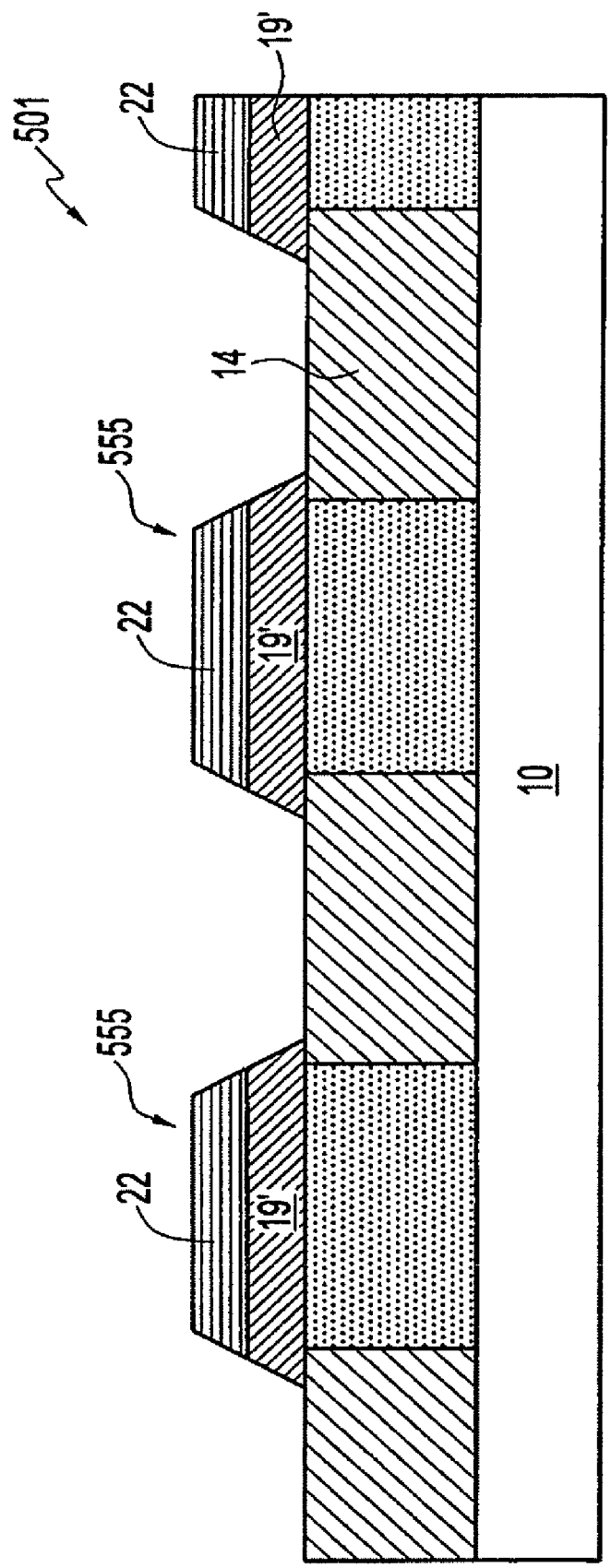

FIGS. 5A and 5B illustrate a phase change memory device 501 according to other embodiments of the invention. The device 501 includes memory cell 505, which includes two memory elements 500a, 500b. The phase change memory device 501 is similar to the phase change memory devices 401 (FIG. 4A) except that the second electrodes 22 are formed as part of a mesa structure 555 with the dielectric mesa 19'. The phase change material layers 16 are formed on sidewalls of the mesa structure 555.

FIG. 5B shows the formation of the memory device 501 in accordance with an embodiment of the invention. No particular order is required for any of the actions described herein, except for those logically requiring the results of prior actions. Accordingly, while the actions below are described as being performed in a specific order, the order can be altered if desired.

The first electrodes 14 are formed as described in connection with FIG. 3A above. As shown in FIG. 5B, mesa structures 555 are formed, each including a dielectric layer 19' and a second electrode 22. The second electrode 22 is formed as a layer of the mesa structure 555. The mesa structure 555 is formed to overlie portions of two first electrodes 14. A layer 16 of phase change material is formed on the sidewalls of the mesa structure 555. The mesa structure 555 can be formed by, for example, patterning and etching a dielectric layer and conductive layer using known photolithography and etching techniques. The phase change material layers 16 are formed on sidewalls of the mesa structure 555 to achieve the structure shown in FIG. 5A.

Similar to device 201 (FIGS. 2A-2B), the mesa structure(s) 555 of the illustrated embodiment is substantially circular from a top-down perspective. Accordingly, the phase change material layers 16 are annular from a top-down perspective. The mesa structures 555 and phase change material layers 16, however, may have other shapes, as discussed above.

FIGS. 6-9 illustrate additional embodiments of the invention. The embodiments shown in FIGS. 6-9 are similar to the embodiments of FIGS. 2A-5B. In the FIGS. 6-9 embodiments, however, each first and second electrode is associated with two memory elements. Preferably, a particular first electrode and a particular second electrode are not associated with the same two memory elements to allow for individual selection of each memory element during operation. In the FIG. 6-9 embodiments, instead of forming the phase change material layers on sidewalls of an opening (as in FIGS. 2A-3D) or a mesa structure (as in FIGS. 4A-5B), the first electrodes are formed on sidewalls of an opening or mesa structure as described below.

Figure 6:
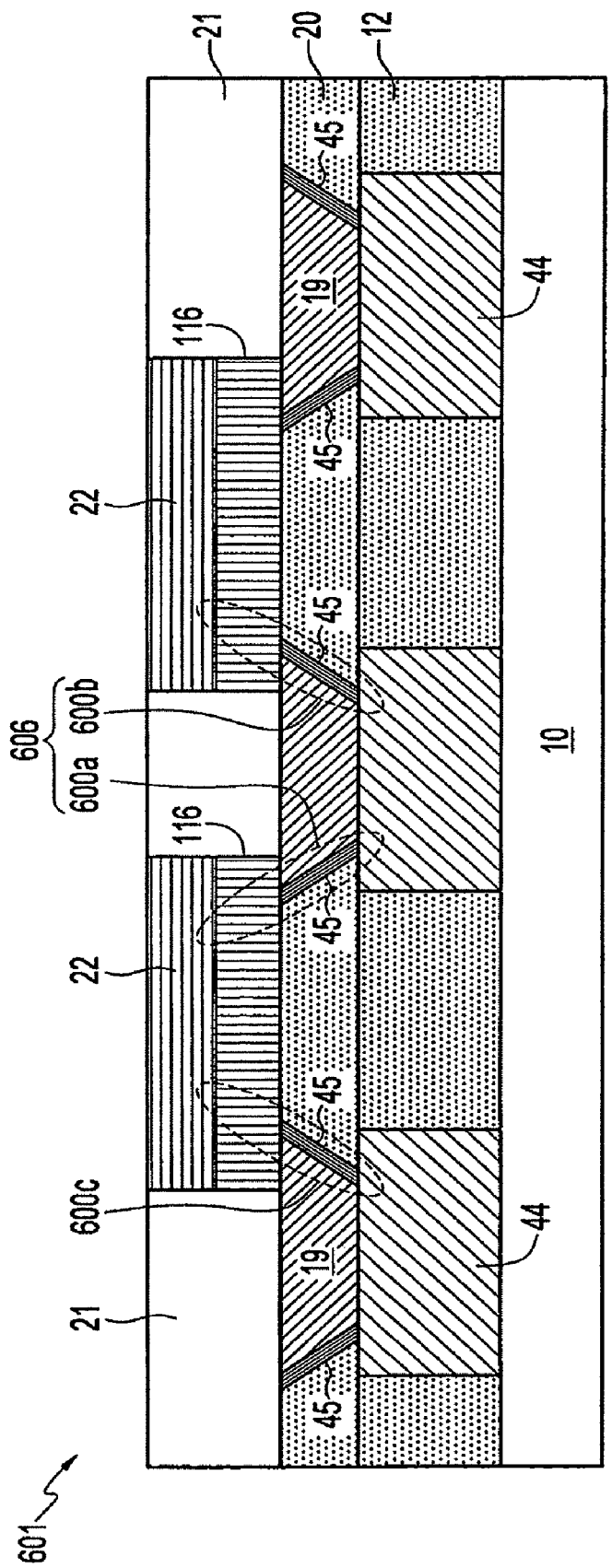
FIGS. 6-9 illustrate partial cross-sectional views of a phase change memory devices according to additional embodiments of the invention.

FIG. 6 depicts a phase change memory device 601 having a memory cell 606 that includes memory elements 600a, 600b according to the invention. The phase change memory device 601 includes conductive plugs 44 for contacting first electrodes 45. The conductive plugs 44 are formed in the same manner as the first electrodes 14 as described in connection with FIG. 3A above.

The first electrodes 45 are on sidewalls of dielectric material layers 19. The first electrodes 45 and dielectric material layers 19 are formed in a similar manner to the phase change material layer 16 and dielectric material layers 19 as described in FIGS. 3B-3D above. Accordingly, a conductive material for electrodes 45 is formed on sidewalls of the openings in insulating layer 20. Dielectric material layers 19 are then formed within the openings between the first electrodes 45. From a top-down perspective the dielectric material layers 19 are substantially circular. Accordingly, the first electrodes 45 are annular from a top-down perspective. The dielectric material layers 19 and first electrodes 45, however, can have other shapes.

Optionally, the first electrodes need not fully cover the sidewalls of the dielectric material layers 19, and only need be formed so as to provide electrical communication between a respective conductive plug 44 and phase change material layer 116 for a single memory element 600a, 600b. Further, while the thickness of the first electrodes 45 is shown being uniform, the invention is not so limited.

Phase change material layers 116 and second electrodes 22 are within an insulating layer 21 and over the first electrodes 45. As shown in FIG. 6, the phase change material layers 16 and second electrodes 22 are offset from the first electrodes 45 and conductive plugs 44. Thus, a phase change material layer 116 is in contact with two adjacent first electrodes 45. Also, each top electrode 22 serves two memory elements 600a, 600c.

Figure 7:
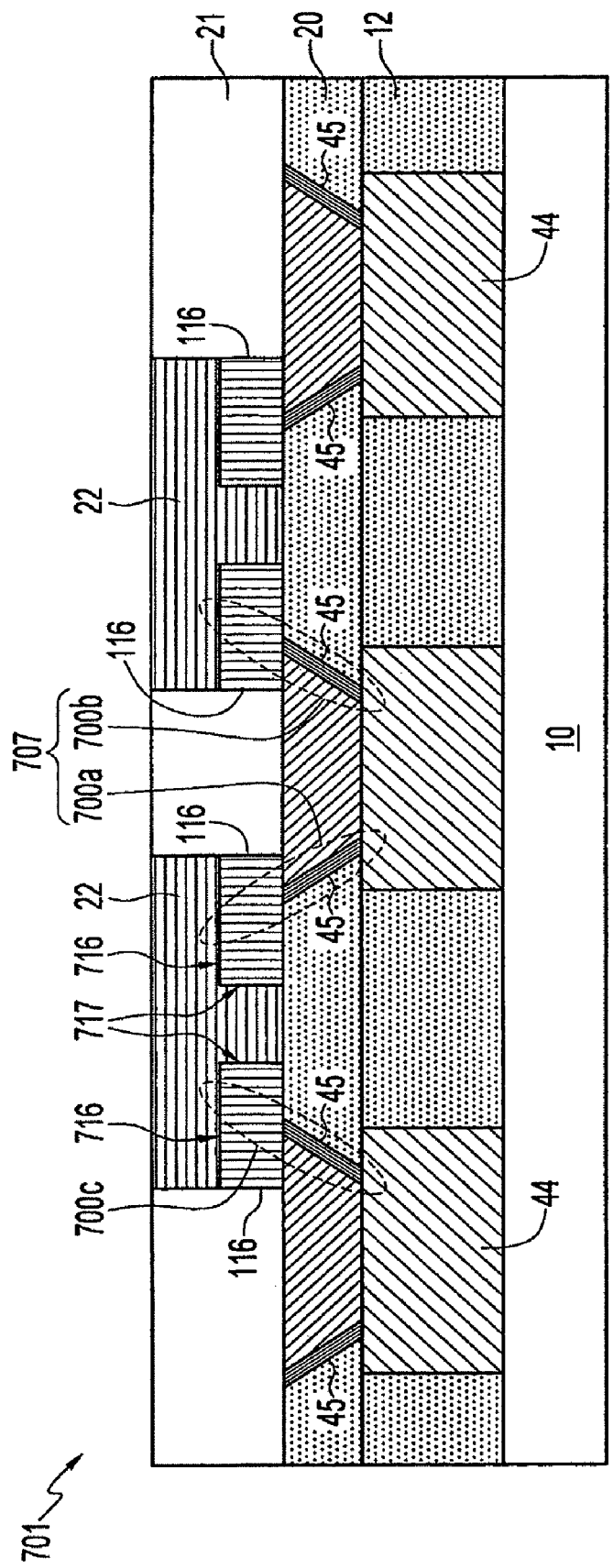

The memory device 701 shown in FIG. 7 is similar to memory device 601, except that there is a phase change material layer 116 for each first electrode 45. The memory device 701 includes a memory cell 707, which includes memory elements 700a, 700b. Each second electrode 22 serves two memory elements 700a, 700c. In the embodiment of FIG. 7, the second electrode 22 serving two memory elements 700a, 700c extends between the phase change material layers 116 for those two memory elements 700a, 700c. Accordingly, the second electrode 22 is in contact with top surfaces 716 and lateral surfaces 717 of the phase change material layers 113. To achieve the top electrode 22 structure shown in FIG. 7, the phase change material layer 116 are be patterned and etched prior to the formation of the top electrodes 22.

Figure 8:
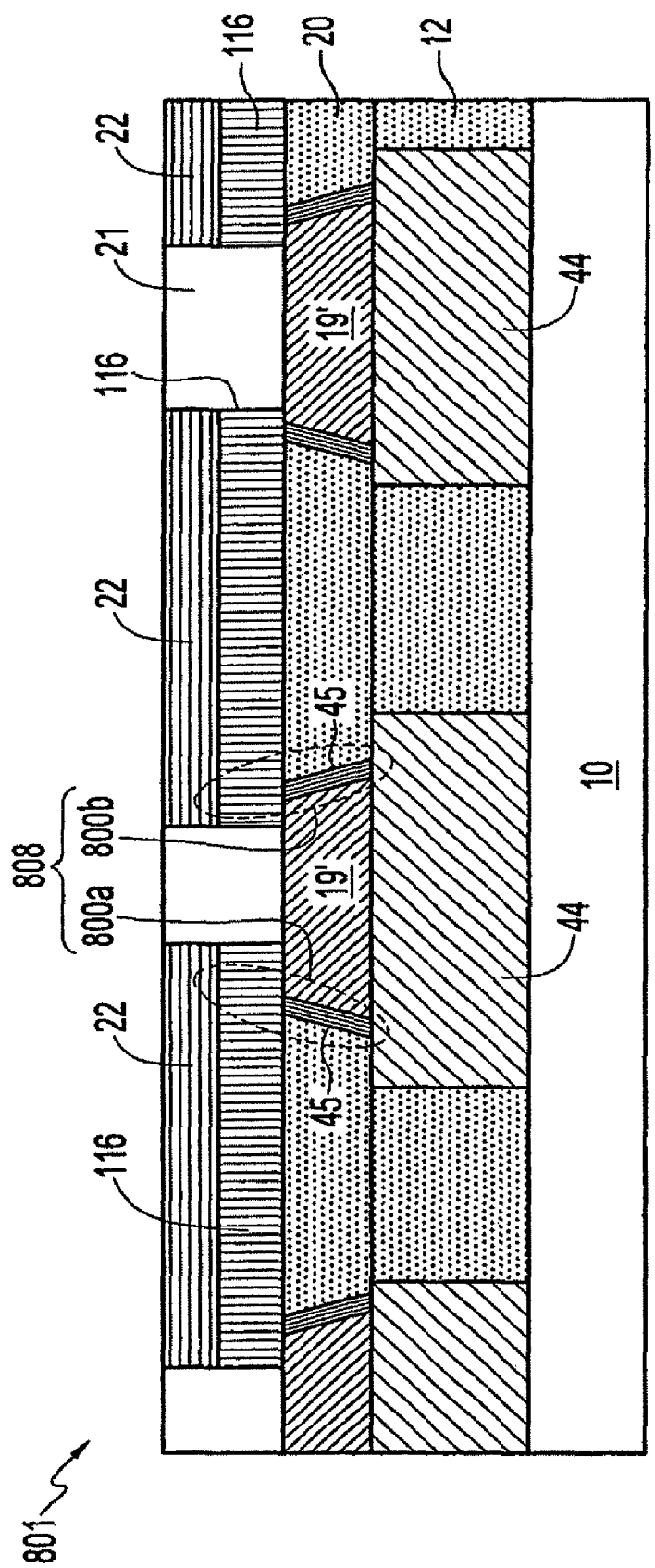

FIG. 8 illustrates memory device 801 having a memory cell 808, which includes memory elements 800a, 800b according to the invention. The memory device 801 is similar to memory device 601 (FIG. 6) except that the first electrodes 45 are formed on sidewalls of a dielectric mesa 19'. The dielectric mesas 19' and first electrodes 45 are formed in a similar manner to the phase change material layer 16 and dielectric material layers 19 as described in FIGS. 3B-3D above.

Figure 9:
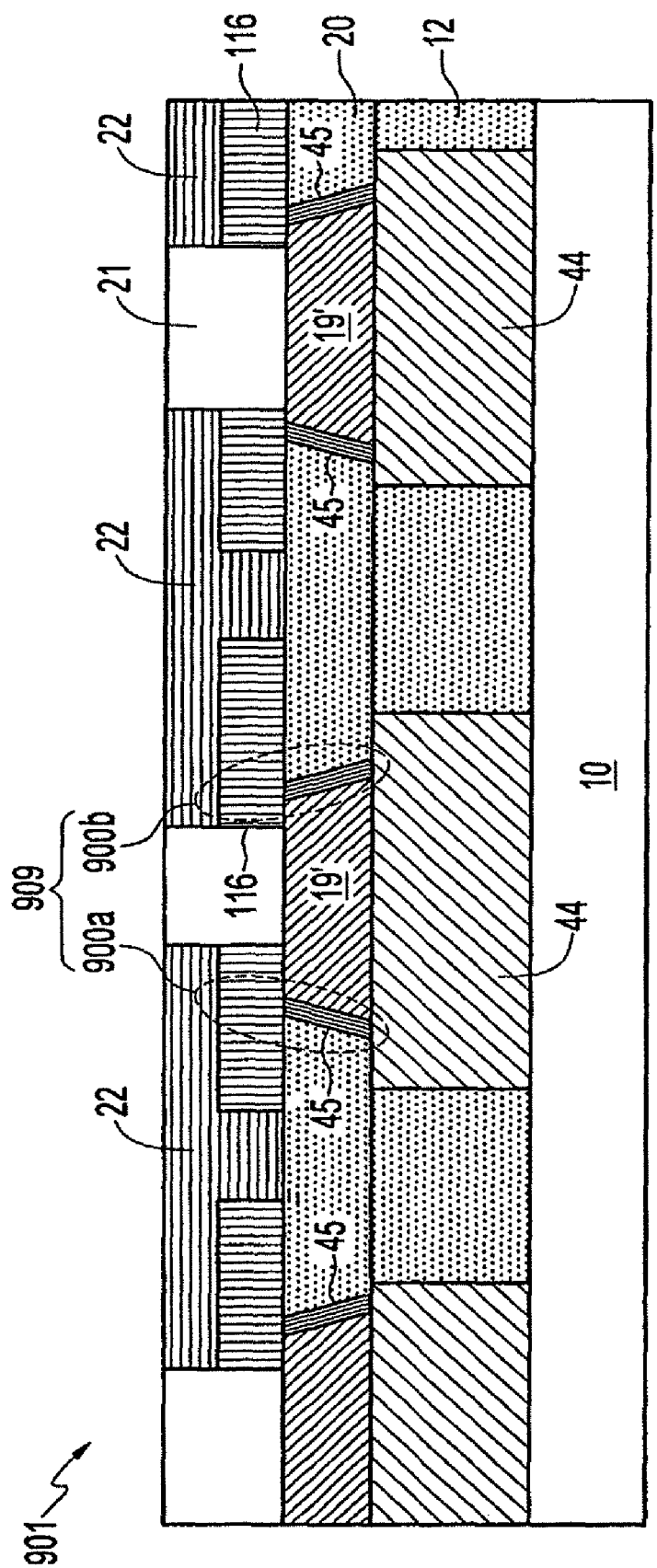

FIG. 9 illustrates memory device 901 having a memory cell 909, which includes memory elements 900a, 900b according to the invention. The memory device 901 is similar to memory device 701 (FIG. 7) except that the first electrodes 45 are formed on sidewalls of a dielectric mesa 19'. The dielectric mesas 19' and first electrodes 45 are formed in a similar manner to the phase change material layer 16 and dielectric material layers 19 as described in FIGS. 3B-3D above.

Figure 10:
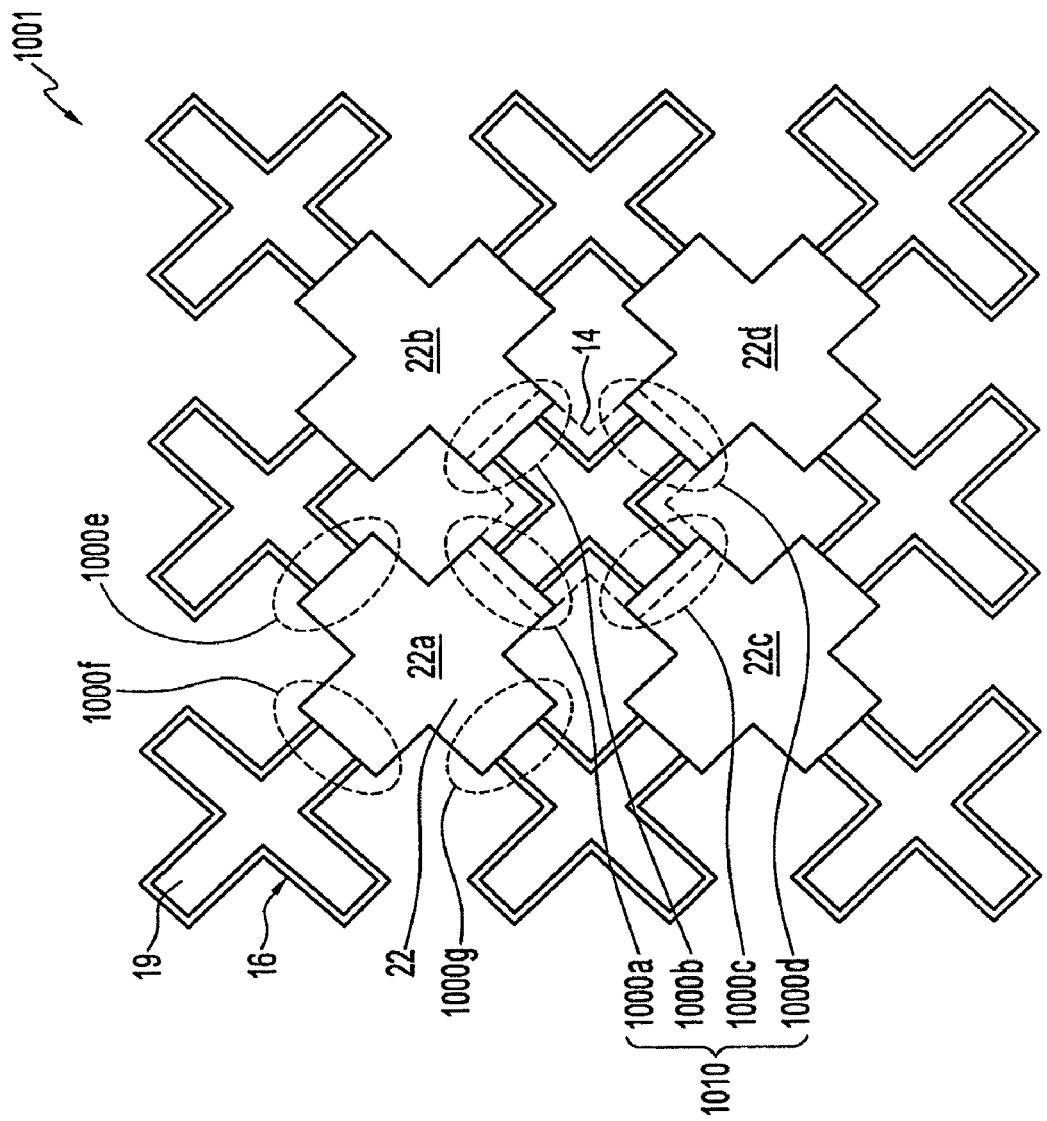
FIG. 10 illustrates a top-down view of a phase change memory device according to another embodiment of the invention.

Although the embodiments shown in FIGS. 2A-9 show memory cells including two memory elements, the invention, however, is not so limited. Memory cells according to the invention can include more than two memory elements. For example, as shown in FIG. 10, the memory device 1001 includes memory cells 1010, which include memory elements 1000a, 1000b, 1000c, 1000d. Each of the memory elements 1000a, 1000b, 1000c, 1000d of the memory cell 1000 is associated with a same first electrode 14. The memory element 1000a is associated with a first, second electrode 22a; the memory element 1000b is associated with a second, second electrode 22b; the memory element 1000c is associated with a third, second electrode 22c; and the memory element 1000d is associated with a fourth, second electrode 22d. Thus, each memory cell 1010 is associated with four different second electrodes 22.

In the illustrated embodiment, second electrode 22 is shared by four memory elements 1000a, 1000e, 1000f, 1000g. To allow each memory element 1000a, 1000b, 1000c, 1000d, 1000e, 1000f, 1000g to be addressed individually, only one memory element, e.g., element 1000a, is addressable by a particular first and second electrode 14, 22 set.

The memory device 1001 memory elements 1000a, 1000b, 1000c, 1000d, 1000e, 1000f, 1000g have a structure similar to any of those described above in connection with FIGS. 2B-9 and are formed in a similar manner, except that each memory cell is configured to include four memory elements 1000a, 1000b, 1000c, 1000d. For this, the first electrode 14 of the memory cell 1010 is configured to be associated with the memory elements 1000a, 1000b, 1000c, 1000d. In the FIG. 10 embodiment, the first and second electrodes 14, 22 have approximately a plus-sign ("+") shape, but other shapes are possible, such as a cross, x, diamond, square, among others.

Figure 11A:
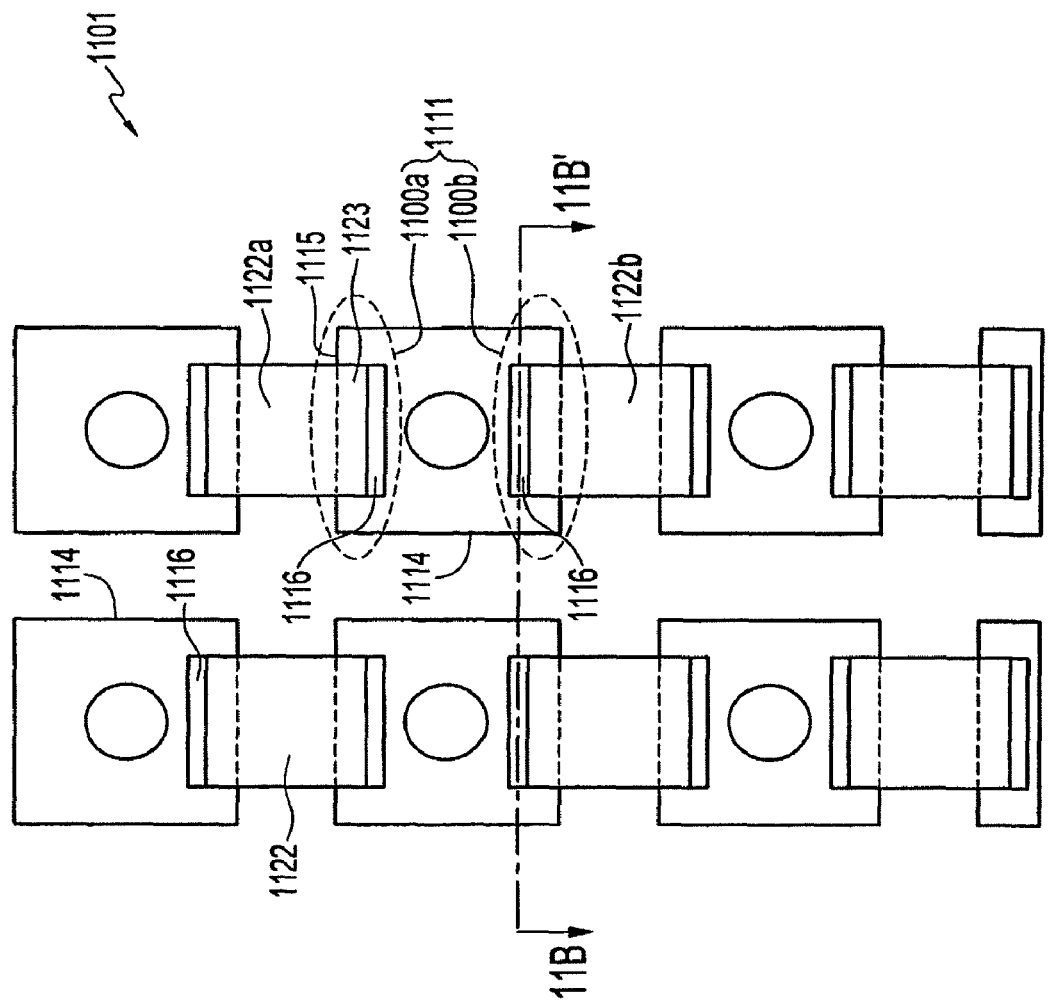

FIGS. 11A-11C illustrate an embodiment of a portion of a resistance variable memory device 1101 constructed in accordance with the invention. FIG. 11A is a top-down view of a portion of the memory device 1101 and FIG. 11B is a cross-sectional view of the FIG. 11A device 1101 along the line 11B-11B'. FIG. 11C is a cross-sectional view of the device 1101 along the line 11C-11C' shown in FIG. 11B.

The memory device 1101 is illustrated as a phase change memory device and includes memory cells 1111, which each include a plurality of phase change memory elements 1100a, 1100b, each for storing at least one bit, i.e., logic 1 or 0. The memory elements 1100a, 1100b are supported by a substrate 10. A first dielectric layer 12 is formed on the substrate 10, and conductive plugs 44 are formed within the first dielectric layer 12. First electrodes 1114 are formed within a second dielectric layer 20. Each first electrode 1114 is formed over and in contact with a conductive plug 44.

A third dielectric layer 1121 (FIG. 11C) is over the first electrodes 1114 and second dielectric layer 20. Second electrodes 1122 are over the third dielectric layers 1121. The third dielectric layers 1121 and second electrodes 1122 are formed as mesas 1133 oriented in rows in the x direction (FIG. 11A). A fourth dielectric layer 1131 is formed over the mesas 1133. In the embodiment of FIG. 11A, from a top-down perspective, the mesas 1133 have a rectangular shape, but other shapes, such as a square or circle are possible. The second electrodes 1122 are formed between adjacent first electrodes 1114 such that lateral edges 1123 of the second electrodes 1122 are directly over lateral edges 1115 of the first electrodes 1114.

Each phase change material layer 1116 is on a sidewall of a respective second electrode 1122 and third dielectric layer 1121 and in contact with a respective first electrode 1114. In the embodiment shown in FIGS. 11A and 11B, the phase change material layers 1116 are only on portions of the second electrode 1122 and third dielectric layer line 1121 sidewalls that are directly over a first electrode 1114.

The memory elements 1100a, 1100b correspond to where a first and second electrode and a portion of a phase change material layer 1116 intersect electrically. Each first electrode 1114 is associated with two memory elements 1100a, 1100b. In the illustrated embodiment, each second electrode 1122 is also associated with two memory elements 1100a, 1100b. To allow each memory element 1100a, 1100b to be individually addressable, a particular first electrode 1114 and a particular second electrode 1122 preferably are not associated with more than one same memory element 1100a, 1100b. In the embodiment shown, the memory element 1100a is associated with a first, second electrode 1122a and the memory element 1100b is associated with a second, second electrode 1122b.

Since the phase change material layer 1116 for each memory element 1100a, 1100b is formed only on a sidewall of a second electrode 1122, the contact area of the phase change material layer 1116 to the electrodes 1114, 1122 for each memory element 1100a, 1100b is minimized. The programming volume of the memory elements 1100a, 1100b and the voltage needed to achieve the phase change for the memory elements 1100a, 1100b is also minimized. Additionally, since the electrodes, 1114, 1122 are shared between memory elements 1100a, 1100b, the bit density of the device 1101 can be increased over prior art devices, e.g., devices including the memory element 1 (FIG. 1). Moreover, the programming volume is fixed for each memory element and does not depend on the programming pulses and device switching uniformity is also improved.

Additional dielectric layers, contact and metal lines can also be included in the device 1101. For example, contacts 1151 to first electrodes 1114 and metal lines can be included.

FIGS. 12A-12E illustrate one embodiment of a method of fabricating the phase change memory device 1101 illustrated in FIGS. 11A and 11B. No particular order is required for any of the actions described herein, except for those logically requiring the results of prior actions. Accordingly, while the actions below are described as being performed in a specific order, the order can be altered if desired.

Figure 12A:
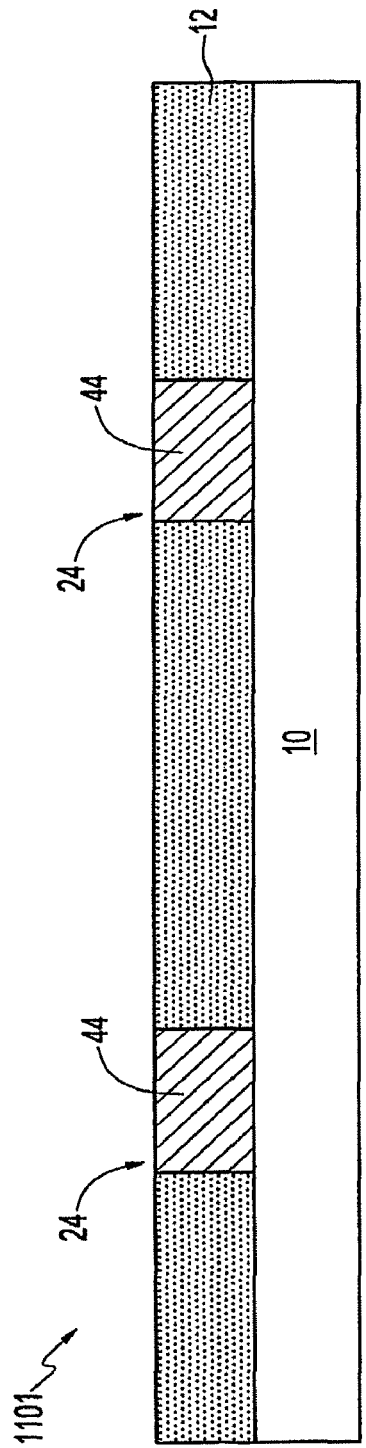
FIGS. 12A-12E illustrate partial cross-sectional views of a method of fabricating the phase change memory device of FIGS. 11A-11C.

As shown in FIG. 12A a first dielectric layer 12 is formed over a substrate 10. The first dielectric layer 12 is typically etched to create vias 24 within which conductive plugs 44 are formed. The conductive plugs 44 are formed of any suitable conductive material, such as titanium-nitride (TiN), titanium-aluminum-nitride (TiAlN), titanium-tungsten (TiW), platinum (Pt) or tungsten (W), among others.

Figure 12B:
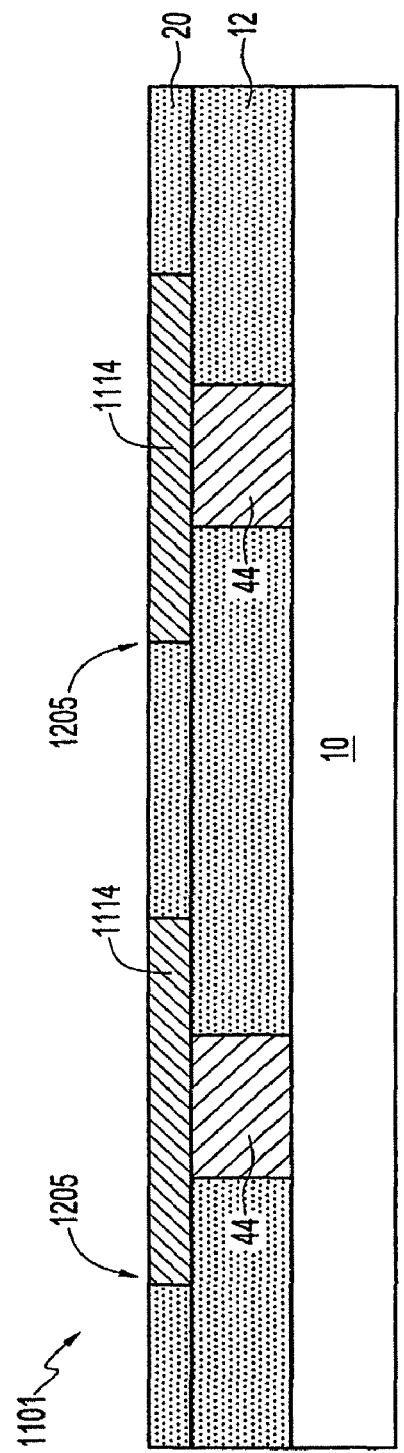

As depicted in FIG. 12B, a second insulating layer 20 is formed over the conductive plugs 44 and the first insulating layer 12. Openings 1205 are formed over and aligned with each conductive plug 44 by any suitable technique. In the illustrated embodiment, the openings 1205 are formed having a substantially square top-down shape, however the openings 1205 may have any shape, e.g., rectangular, square or other shape. The first electrodes are formed of any suitable conductive material, such as titanium-nitride (TiN), titanium-aluminum-nitride (TiAlN), titanium-tungsten (TiW), platinum (Pt) or tungsten (W), among others.

Figure 12C:
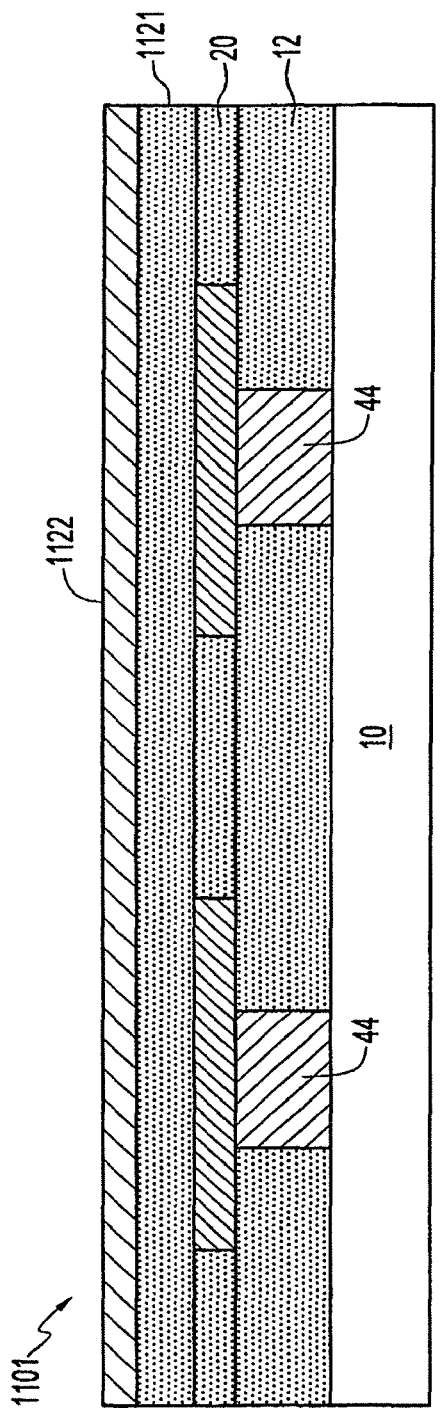

FIG. 12C illustrates the deposition of a third dielectric layer 1121 and a conductive material layer for forming second electrodes 1122. The third dielectric layer 1121 and conductive material layer are patterned into lines to form third dielectric layers 1121 and second electrodes 1122. The lateral edges 1132 (FIG. 11C) of the third dielectric layers 1121 are formed in contact with first electrodes 1114. This allows lateral edges 1123 (FIGS. 11A and 11C) of the second electrodes 1122 to be directly over lateral edges 1115 of the first electrodes 1114. The second electrodes are formed of any suitable conductive material and can be a same material as the conductive plugs 44 and/or the first electrodes 1114.

Figure 12D:
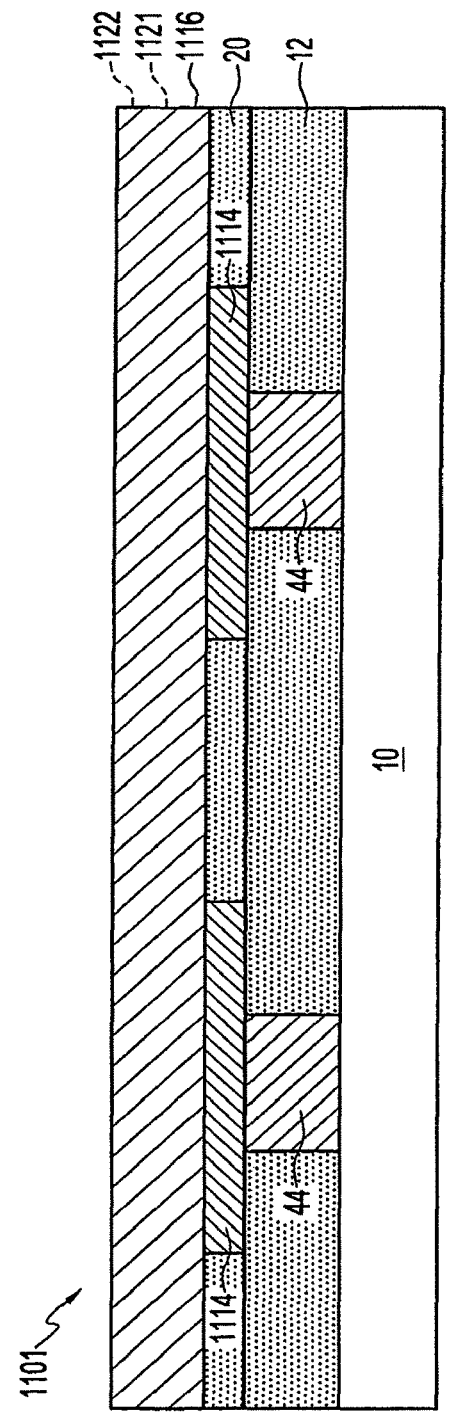

As depicted in FIG. 12D, a layer of phase change material 1116, for example a thin layer having a thickness of about 100 Å, is formed over the second electrodes 1122 and over the first electrodes 1114. Optionally, the sidewalls of the third dielectric layers 1121 and second electrodes 1122 are sloped to promote coverage of the sidewalls with the phase change material layers 1116 as shown in FIG. 11C. The phase change material is any suitable phase change material such as those described above in connection with FIG. 3C.

Figure 12E:
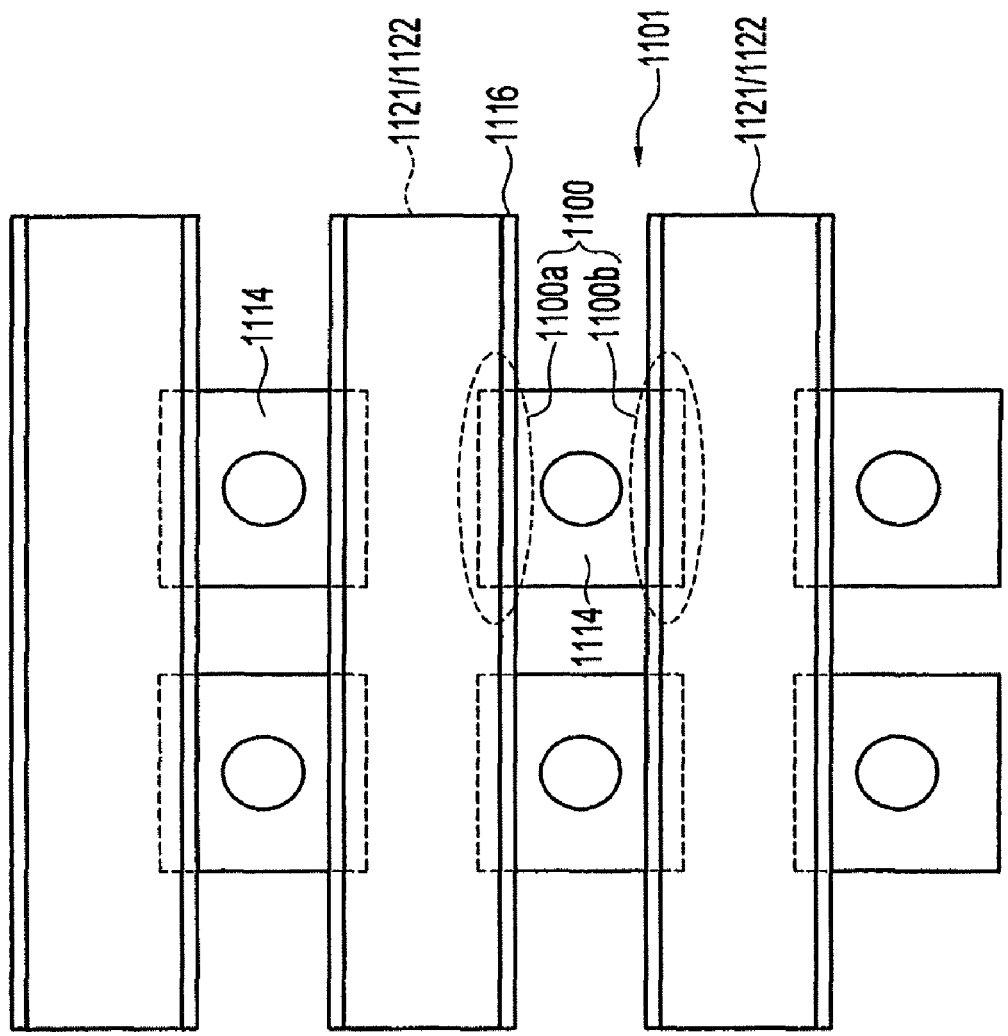

A spacer etch is used to remove the phase change material between the second electrode lines 1122 and on the upper surfaces of the second electrodes 1122, leaving thin layers 1116 of phase change material on the sidewalls of the second electrodes 1122. The programmable volume of the memory elements 1100a, 1100b can be adjusted by adjusting the thickness of the phase change material layers 1116. If desired, the phase change material layers 1116 can be left along the length of the sidewalls of each second electrode 1122. FIG. 12E is a top-down perspective of the memory device 1101 having the phase change material layers 1116 along the length of the sidewalls of each second electrode 1122.

The second electrode lines 1122 and phase change material 1116 are then etched to form individual mesas 1133 (FIGS. 11B and 11C). For this, a layer of photoresist (not shown) is formed to protect the portions of the phase change material layers 1116 in contact with the first electrodes 1114. A dry etch is performed to remove the unprotected portions of the phase change material layers 1116, third dielectric layers 1121 and second electrode lines 1122. To isolate the individual mesas 1133, a fourth dielectric layer 1131 is formed over the mesas 1133 to achieve the structure shown in FIG. 11B. By isolating the phase change material layers 1116 associated with each first electrode 1114, cross talk between memory elements 1100a, 1100b can be reduced.

Embodiments have been described as employing phase change material as a programmable resistance material. Embodiments may also employ one or more layers of other programmable resistance materials in place of the phase change material layer. Examples of other programmable resistance materials include such as metal doped chalcogenide glass and those programmable resistance materials discussed in various patents and patent applications assigned to Micron Technology, Inc., including, but not limited to the following: U.S. patent application Ser. Nos. 10/765,393; 09/853,233; 10/022,722; 10/663,741; 09/988,984; 10/121,790; 09/941,544; 10/193,529; 10/100,450; 10/231,779; 10/893,299; 10/077,872; 10/865,903; 10/230,327; 09/943,190; 10/622,482; 10/081,594; 10/819,315; 11/062,436; 10/899,010; and 10/796,000, the disclosures of each of which are incorporated herein by reference.

Figure 13:
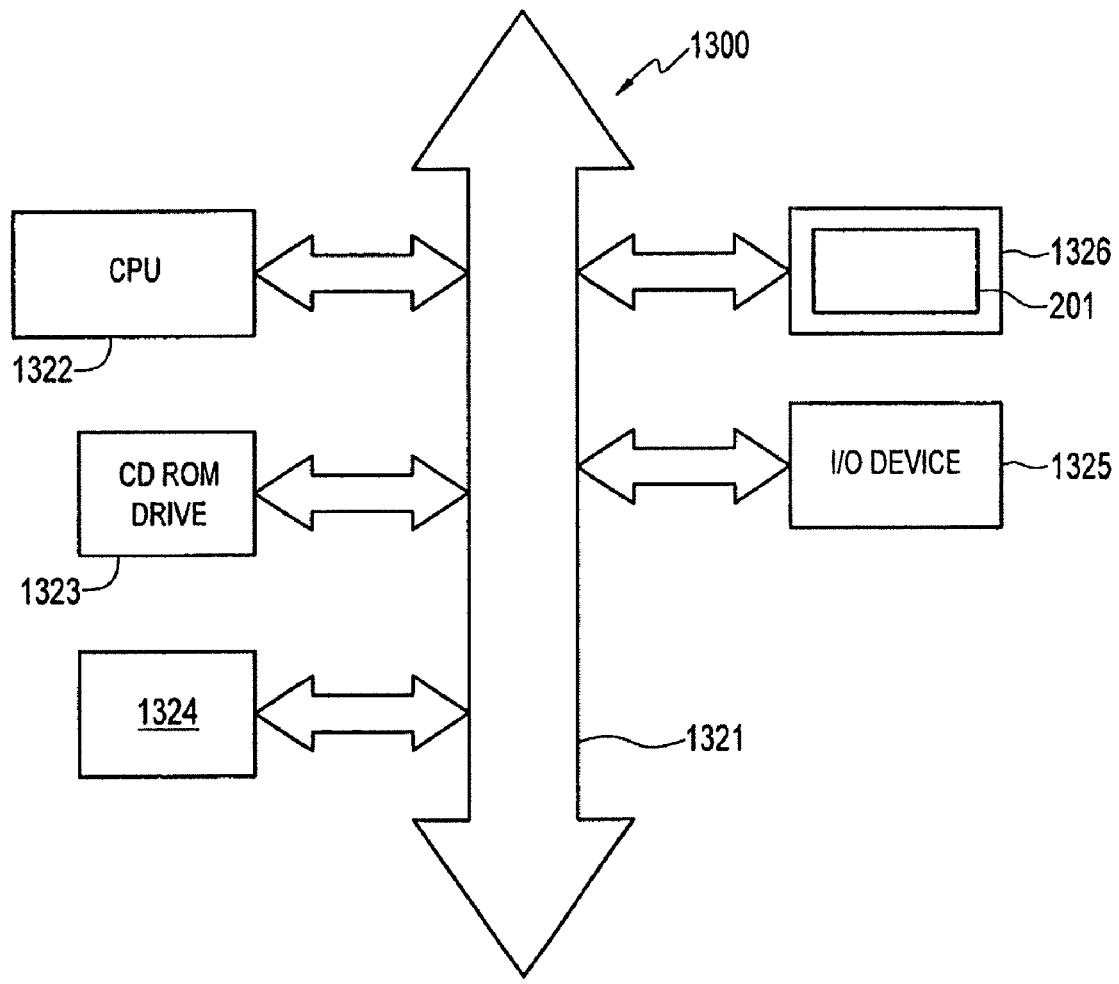
FIG. 13 is a block diagram of a processor system having a memory device incorporating a phase change memory element constructed in accordance with an embodiment of the invention.

FIG. 13 illustrates a simplified processor system 1300 which includes at least one memory circuit 1326 having a resistance variable memory device 201 constructed in accordance with the invention. The memory circuit can instead include any other resistance variable memory device, e.g., devices 401, 501, 601, 701, 801, 901, 1001, 1101, constructed in accordance with the invention.

The FIG. 13 processor system 1300, which can be any system including one or more processors, for example, a computer, phone, PDA, or other control system, generally comprises a central processing unit (CPU) 1322, such as a microprocessor, a digital signal processor, or other programmable digital logic devices, which communicates with an input/output (I/O) device 1325 over a bus 1321. The memory circuit 1326 communicates with the CPU 1322 over bus 1321 typically through a memory controller.

In the case of a computer system, the processor system 1300 may include peripheral devices such as a compact disc (CD) ROM drive 1323, which also communicate with CPU 1322 and hard drive 1324 over the bus 1321. If desired, the memory circuit 1326 may be combined with the processor, for example CPU 1322, in a single integrated circuit.

The above description and drawings are only to be considered illustrative of specific embodiments, which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by letters patent of the United States is:

1. A memory cell comprising:
   a first single electrode;

first and second portions of resistance variable material in contact with the first single electrode, wherein the first and second portions of resistance variable material are on at least a portion of a sidewall of a mesa of dielectric material, and wherein the mesa of dielectric material is in contact with at least a portion of the first single electrode;

a first, second electrode in electrical communication with the first portion of the resistance variable material; and a second, second electrode in electrical communication with the second portion of the resistance variable material.

2. The memory cell of claim 1, wherein the sidewall is vertical relative to a top surface of the first single electrode.

3. The memory cell of claim 1, wherein the sidewall is linear.

4. The memory cell of claim 1, wherein one or both of the first and second portions of resistance variable material completely cover the sidewall.

5. A memory cell comprising:
a first single electrode;
first and second portions of resistance variable material in contact with the first single electrode, wherein the first and second portions of resistance variable material are on at least a portion of a sidewall of a mesa of dielectric material, wherein the sidewall is sloped;
a first, second electrode in electrical communication with the first portion of the resistance variable material; and
a second, second electrode in electrical communication with the second portion of the resistance variable material.

6. A memory cell comprising:
a first single electrode;
first and second portions of resistance variable material in contact with the first single electrode, wherein the first and second portions of resistance variable material are on at least a portion of a sidewall of a mesa of dielectric material, wherein the sidewall is non-linear;
a first, second electrode in electrical communication with the first portion of the resistance variable material; and
a second, second electrode in electrical communication with the second portion of the resistance variable material.

7. A memory cell comprising:
a first single electrode;
first and second portions of resistance variable material in contact with the first single electrode, wherein the first and second portions of resistance variable material are on at least a portion of a sidewall of a mesa of dielectric material, wherein the sidewall is bowed;
a first, second electrode in electrical communication with the first portion of the resistance variable material; and
a second, second electrode in electrical communication with the second portion of the resistance variable material.

8. A memory cell comprising:
a first single electrode;
first and second portions of resistance variable material in contact with the first single electrode, wherein the first and second portions of resistance variable material are at least a portion of a sidewall of an opening in the first dielectric material, and wherein the opening is filled with a dielectric material;
a first, second electrode in electrical communication with the first portion of the resistance variable material; and a second, second electrode in electrical communication with the second portion of the resistance variable material.

9. A memory cell comprising:
a first single electrode;
first and second portions of resistance variable material in contact with the first single electrode, wherein the first portion of resistance variable material is over a first portion of the first single electrode, and wherein the second portion of resistance variable material is over a second portion of the first single electrode;
a first, second electrode in electrical communication with the first portion of the resistance variable material, wherein the first, second electrode is over the first single electrode; and
a second, second electrode in electrical communication with the second portion of the resistance variable material, wherein the second, second electrode is over the first single electrode.

10. A memory cell comprising:
a first single electrode;
first and second portions of resistance variable material in contact with the first single electrode, wherein the first portion of resistance variable material is on a sidewall of a first, second electrode, and wherein the second portion of resistance variable material is on a sidewall of a second, second electrode;
the first, second electrode in electrical communication with the first portion of the resistance variable material; and
the second, second electrode in electrical communication with the second portion of the resistance variable material.

11. The memory cell of claim 10, wherein the first portion of resistance variable material is only on a portion of the sidewall of the first, second electrode that is directly over the first single electrode, and wherein the second portion of resistance variable material is only on a portion of the sidewall of the second, second electrode that is directly over the first single electrode.

12. The memory cell of claim 10, wherein the first portion of resistance variable material is along the length of the sidewall of the first, second electrode, and wherein the second portion of resistance variable material is along the length of the sidewall of the second, second electrode.

13. The memory cell of claim 10, wherein the first portion of resistance variable material is only the sidewall of the first, second electrode, and wherein the second portion of resistance variable material is only on a the sidewall of the second, second electrode.

14. The memory cell of claim 10, wherein the sidewall of the first, second electrode and the sidewall of the second, second electrode are sloped.

15. A memory cell comprising:
a first single electrode, wherein the first single electrode is on sidewalls of an opening in a first dielectric material, and wherein the opening is filled with a second dielectric material;
first and second portions of resistance variable material in contact with the first single electrode;
a first, second electrode in electrical communication with the first portion of the resistance variable material; and
a second, second electrode in electrical communication with the second portion of the resistance variable material.

16. A memory cell comprising:
a first single electrode, wherein the first single electrode is on sidewalls of a dielectric mesa;

first and second portions of resistance variable material in contact with the first single electrode;
a first, second electrode in electrical communication with the first portion of the resistance variable material; and
a second, second electrode in electrical communication with the second portion of the resistance variable material.

17. A memory cell comprising:
a first single electrode;
first and second portions of resistance variable material in contact with the first single electrode;
a first, second electrode in electrical communication with the first portion of the resistance variable material; and
a second, second electrode in electrical communication with the second portion of the resistance variable material, wherein the first, second electrode and second, second electrode are conductive mesas, wherein the first portion of resistance variable material is in contact with at least a portion of a sidewall of the first, second electrode, and wherein the second portion of resistance variable material is in contact with at least a portion of a sidewall of the second, second electrode.

18. A memory cell comprising:
a first single electrode;
first and second portions of resistance variable material in contact with the first single electrode;
a first, second electrode in electrical communication with the first portion of the resistance variable material; and
a second, second electrode in electrical communication with the second portion of the resistance variable material, wherein the first, second electrode and second, second electrode are conductive mesas, wherein the conductive mesas have a rectangular shape from a top down perspective.

19. A memory cell comprising:
a first single electrode, wherein the first single electrode has approximately a "+" shape from a top-down perspective;
first and second portions of resistance variable material in contact with the first single electrode;
a first, second electrode in electrical communication with the first portion of the resistance variable material; and
a second, second electrode in electrical communication with the second portion of the resistance variable material.

20. A memory cell comprising:
a first single electrode, wherein the first single electrode has an oval shape from a top-down perspective;
first and second portions of resistance variable material in contact with the first single electrode;
a first, second electrode in electrical communication with the first portion of the resistance variable material; and
a second, second electrode in electrical communication with the second portion of the resistance variable material.

21. A memory cell comprising:
a first single electrode, wherein the first single electrode has an annular shape from a top-down perspective;
first and second portions of resistance variable material in contact with the first single electrode;
a first, second electrode in electrical communication with the first portion of the resistance variable material; and
a second, second electrode in electrical communication with the second portion of the resistance variable material.

22. A memory cell comprising:
a first single electrode;
first and second portions of resistance variable material in contact with the first single electrode;
a first, second electrode in electrical communication with the first portion of the resistance variable material;
a second, second electrode in electrical communication with the second portion of the resistance variable material;
a third, second electrode in electrical communication with a third portion of the resistance variable material; and
a fourth, second electrode in electrical communication with a fourth portion of the resistance variable material.

23. The memory cell of claim 22, wherein the first single electrode has approximately a "+" shape from a top-down perspective.

24. The memory cell of claim 22, wherein the first single electrode is associated with at least one other memory cell.

25. The memory cell of claim 22, wherein at least one of the first, second electrode, the second, second electrode, the third, second electrode and the fourth second electrode are associated with at least one other memory cell.

* * * * *

UNITED STATES PATENT AND TRADEMARK OFFICE
CERTIFICATE OF CORRECTION

| | | |
|---|---|---|
| PATENT NO. | : 8,030,636 B2 | Page 1 of 1 |
| APPLICATION NO. | : 12/848891 | |
| DATED | : October 4, 2011 | |
| INVENTOR(S) | : Jun Liu | |

It is certified that error appears in the above-identified patent and that said Letters Patent is hereby corrected as shown below:

On the cover page, item (56), under "Other Publications", in column 2, line 2, delete "Chalcogenlde" and insert -- Chalcogenide --, therefor.

In column 12, line 48, in Claim 13, delete "a the" and insert -- the --, therefor.

Signed and Sealed this
Sixth Day of December, 2011

David J. Kappos
*Director of the United States Patent and Trademark Office*